(12) United States Patent
Konomi

(10) Patent No.: US 11,824,011 B2
(45) Date of Patent: Nov. 21, 2023

(54) MEMORY DEVICE AND METHOD OF MANUFACTURING MEMORY DEVICE

(71) Applicant: Kioxia Corporation, Tokyo (JP)

(72) Inventor: Kenji Konomi, Yokohama (JP)

(73) Assignee: Kioxia Corporation, Tokyo (JP)

( * ) Notice: Subject to any disclaimer, the term of this patent is extended or adjusted under 35 U.S.C. 154(b) by 180 days.

(21) Appl. No.: 17/163,759

(22) Filed: Feb. 1, 2021

(65) Prior Publication Data

US 2021/0296255 A1 Sep. 23, 2021

(30) Foreign Application Priority Data

Mar. 23, 2020 (JP) .................................. 2020-051544

(51) Int. Cl.
*H01L 23/544* (2006.01)
*H01L 21/78* (2006.01)
*H10B 43/27* (2023.01)

(52) U.S. Cl.
CPC ............ *H01L 23/544* (2013.01); *H01L 21/78* (2013.01); *H10B 43/27* (2023.02); *H01L 2223/54426* (2013.01)

(58) Field of Classification Search
CPC . H01L 27/11582; H01L 23/544; H01L 21/78; H01L 2223/54426
See application file for complete search history.

(56) References Cited

U.S. PATENT DOCUMENTS

| | | | |
|---|---|---|---|
| 6,821,867 B2 | 11/2004 | Matsuura et al. | |
| 10,020,314 B1* | 7/2018 | Baraskar | H01L 27/11565 |
| 10,026,698 B2 | 7/2018 | Konomi | |
| 2015/0263029 A1* | 9/2015 | Kim | H01L 27/11573 257/314 |
| 2021/0013304 A1* | 1/2021 | Ryu | H10B 43/35 |

FOREIGN PATENT DOCUMENTS

JP 2007-173325 A 7/2007

* cited by examiner

*Primary Examiner* — Mohammad M Choudhry
(74) *Attorney, Agent, or Firm* — Oblon, McClelland, Maier & Neustadt, L.L.P.

(57) ABSTRACT

According to one embodiment, a memory device includes: a first layer stack provided in a first area of a substrate; second and third layer stacks provided in a second area of the substrate; a memory cell provided in the first layer stack; a first mark portion provided in the second layer stack; a second mark portion provided in the third layer stack; and a first portion provided between the second layer stack and the third layer stack.

6 Claims, 21 Drawing Sheets

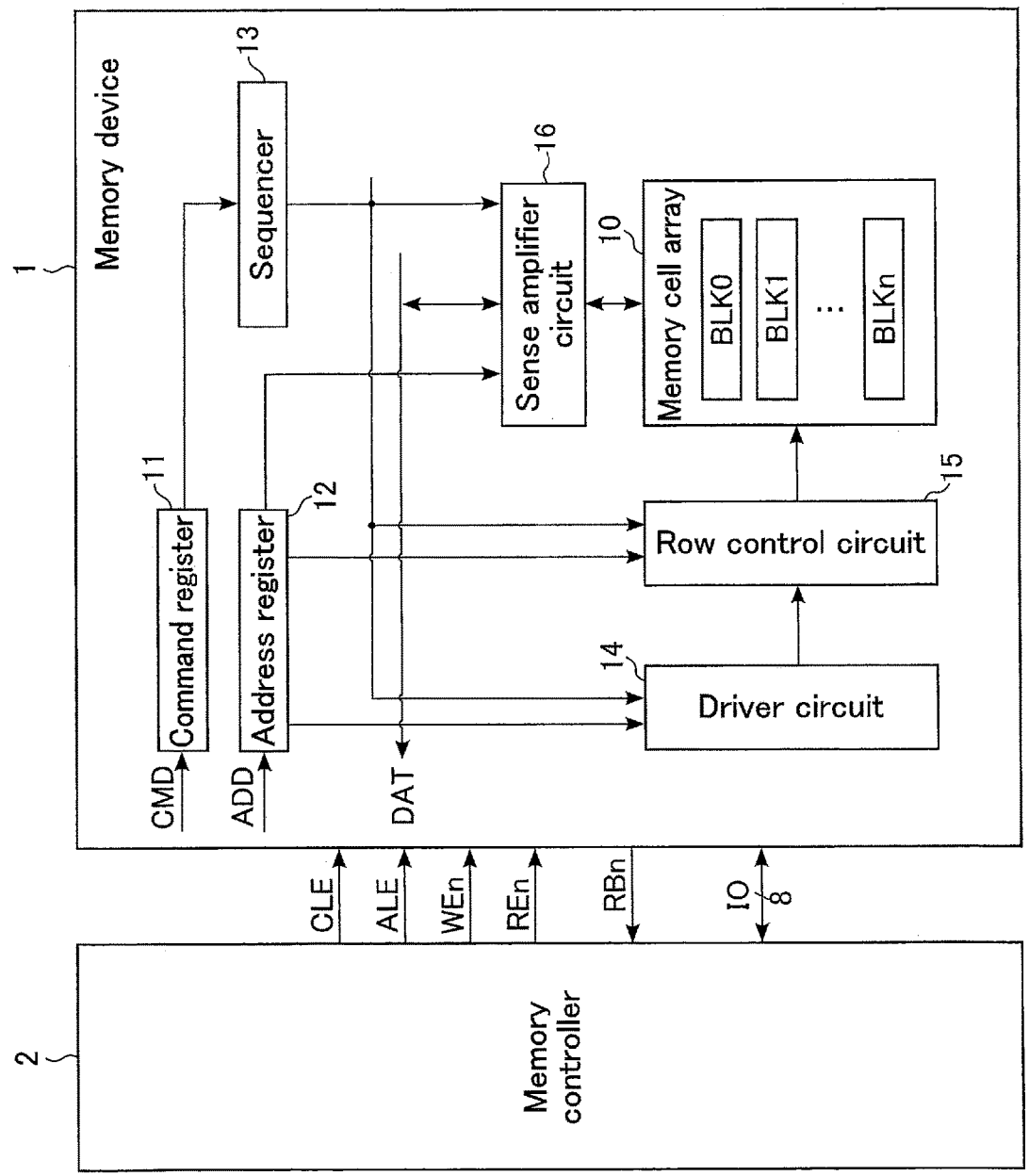
F I G. 1

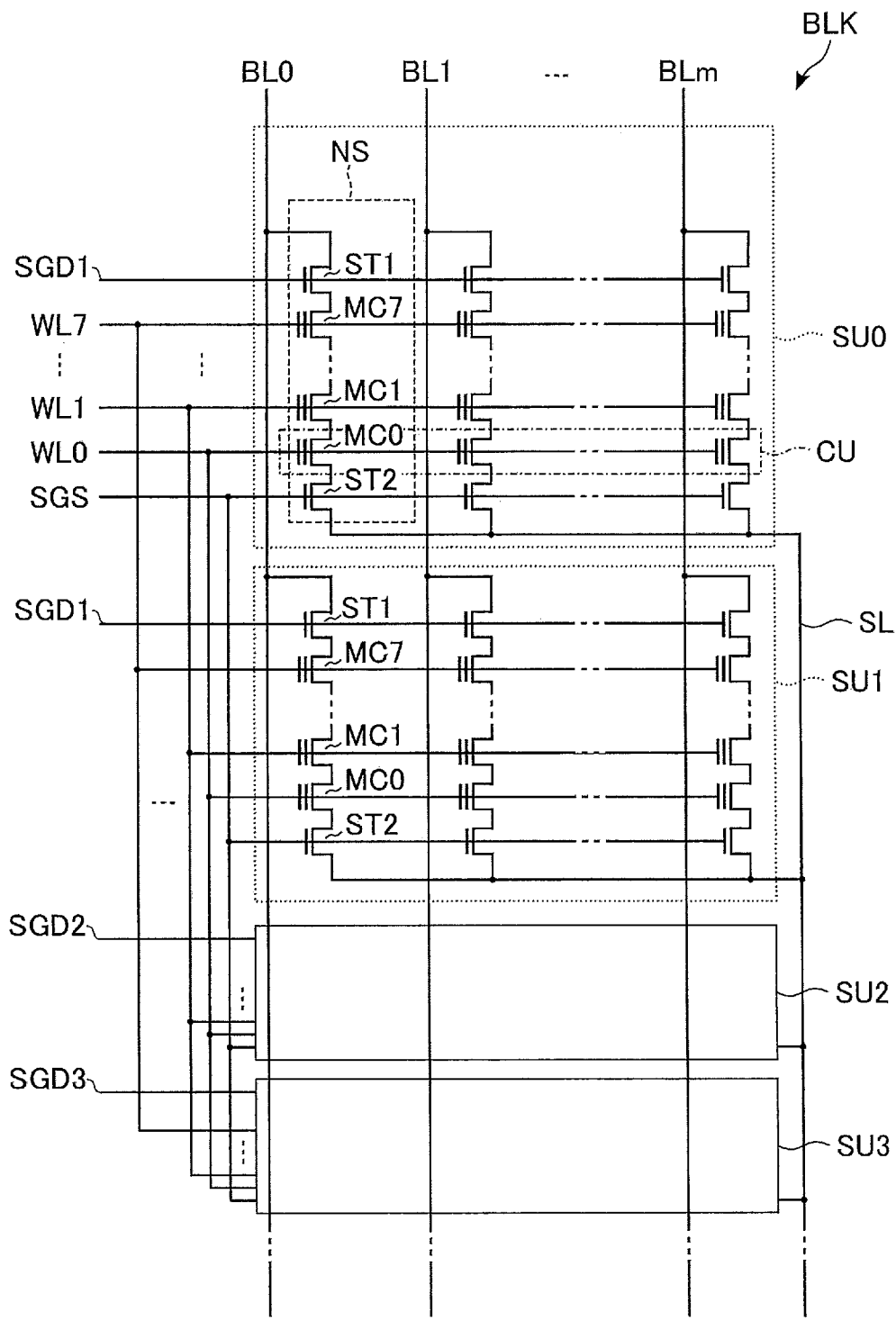
F I G. 2

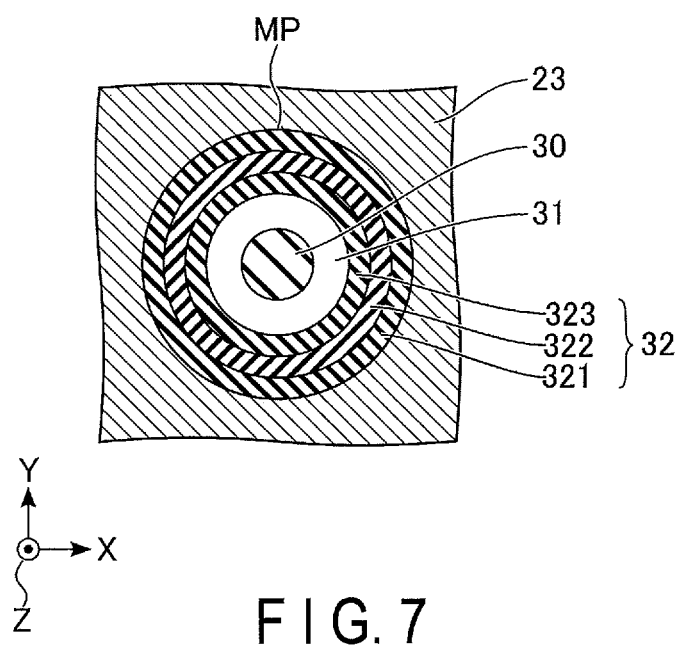
F I G. 7

MEMORY DEVICE AND METHOD OF MANUFACTURING MEMORY DEVICE

CROSS-REFERENCE TO RELATED APPLICATIONS

This application is based upon and claims the benefit of priority from Japanese Patent Application No. 2020-051544, filed Mar. 23, 2020, the entire contents of which are incorporated herein by reference.

FIELD

Embodiments described herein relate generally to a memory device and a method of manufacturing a memory device.

BACKGROUND

A NAND flash memory having a three-dimensional structure is known.

BRIEF DESCRIPTION OF THE DRAWINGS

FIG. 1 is a block diagram of a memory device of an embodiment.

FIG. 2 is an equivalent circuit diagram of a memory cell array of the memory device of the embodiment.

FIG. 7 is a diagram showing an example of the structure of a memory cell of the memory device of the embodiment.

DETAILED DESCRIPTION

Figure 3:
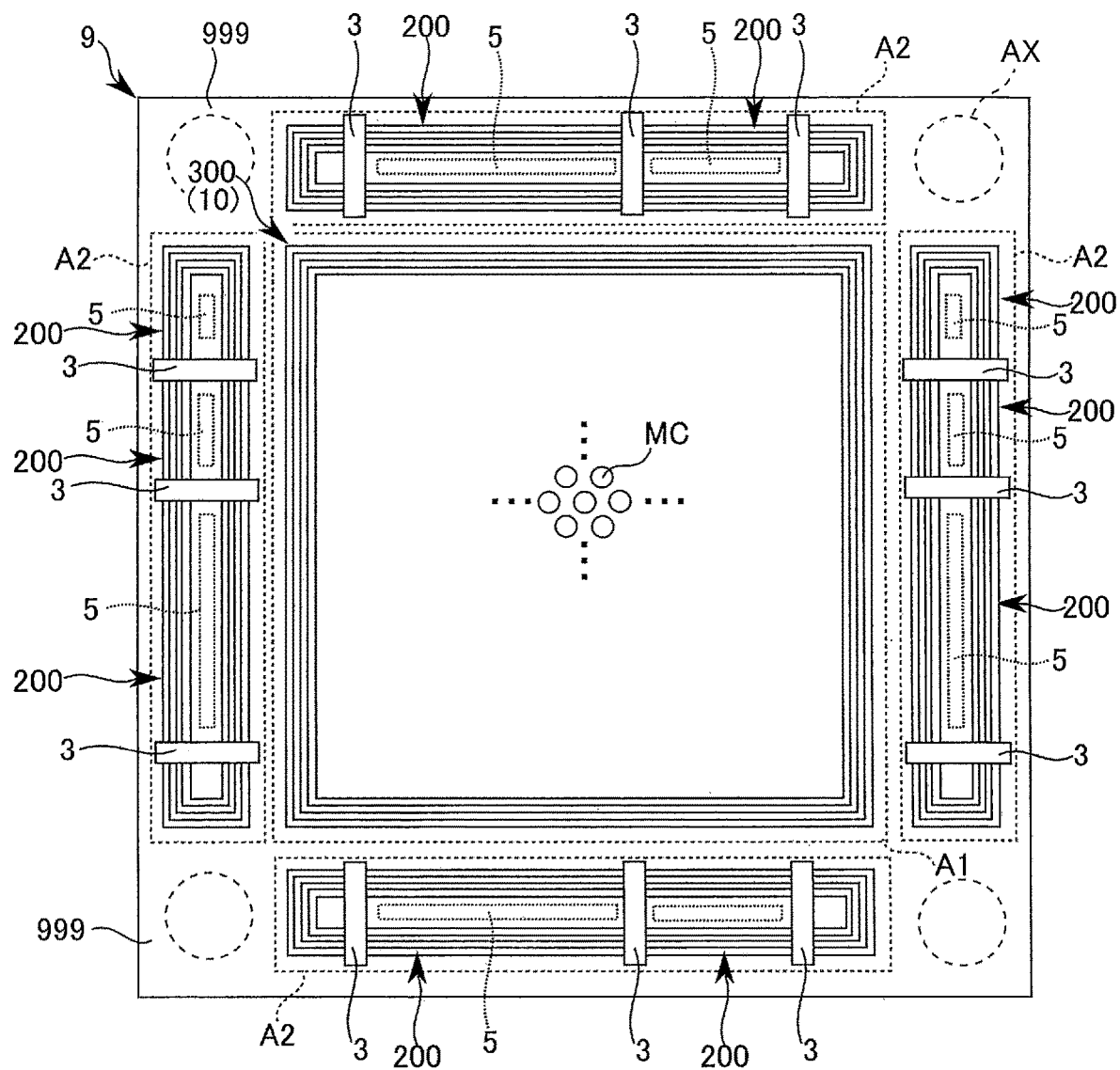
FIG. 3 is a top view showing a structure of a chip of the memory device of the embodiment.

In general, according to one embodiment, a memory device includes: a first layer stack provided in a first area of a substrate; second and third layer stacks provided in a second area of the substrate; a memory cell provided in the first layer stack; a first mark portion provided in the second layer stack; a second mark portion provided in the third layer stack; and a first portion provided between the second layer stack and the third layer stack.

Hereinafter, embodiments will be described with reference to the accompanying drawings. Each embodiment is an example of a device or method that embodies a technical idea of the invention. The drawings are schematic or conceptual, and the dimensions, ratios, and the like in the drawings are not always the same as the actual ones. The technical idea of the present invention is not specified by the shapes, structures, arrangements, etc. of the constituent elements.

[1] Embodiment

A memory device and a method of manufacturing the same according to an embodiment will be described with reference to FIGS. 1 to 21.

(a) Configuration Example

A configuration example of the memory device according to the present embodiment will be described with reference to FIGS. 1 to 7.

FIG. 1 is a block diagram showing a configuration example of the memory device according to the present embodiment.

As shown in FIG. 1, a memory device 1 of the present embodiment is electrically coupled to a memory controller 2.

The memory controller 2 transmits a command CMD, address information ADD, and various control signals to the memory device 1 of the present embodiment.

The memory device 1 receives the command CMD, address information ADD, and various control signals. Data DAT is transferred between the memory device 1 and the memory controller 2. Hereinafter, data DAT transferred from the memory controller 2 to the memory device 1 in a write operation will be referred to as write data. Write data DAT is written in the memory device 1. Data DAT transferred from the memory device 1 to the memory controller 2 in a read operation will be referred to as read data. Read data DAT is read from the memory device 1.

The memory device 1 of the present embodiment includes, for example, a memory cell array 10, a command register 11, an address register 12, a sequencer 13, a driver circuit 14, a row control circuit 15, and a sense amplifier circuit 16.

The memory cell array 10 stores data. A plurality of bit lines and a plurality of word lines are provided in the memory cell array 10. The memory cell array 10 includes a plurality of blocks BLK0 to BLKn (where n is an integer not less than 1). Each block BLK is a set of memory cells, and is used as, for example, a data erase unit. Each memory cell is associated with one bit line and one word line. The configuration of the memory cell array 10 will be described later.

The command register 11 retains a command CMD received from the memory controller 2. The command CMD is a signal set for causing, for example, the sequencer 13 to execute a read operation, a write operation, or an erase operation.

The address register 12 retains address information ADD received from the memory controller 2. The address information ADD includes, for example, a block address, a page address, and a column address. For example, the block address, the page address, and the column address are used to select a block BLK, a word line, and a bit line, respectively. Hereinafter, the block selected based on the block address will be referred to as a selected block. The word line selected based on the page address will be referred to as a selected word line.

The sequencer 13 controls the operation of the entire memory device 1. For example, the sequencer 13 controls the driver circuit 14 based on the command CMD in the command register 11.

The driver circuit 14 outputs voltages used in a read operation, a write operation, an erase operation, and the like to the memory cell array 10. The driver circuit 14 applies a predetermined voltage to, for example, an interconnect corresponding to a selected word line, based on the page address in the address register 12.

The row control circuit 15 controls operations relating to the rows of the memory cell array 10. The row control circuit 15 selects one block BLK in the memory cell array 10, based on the block address in the address register 12. The row control circuit 15, for example, transfers a voltage applied to an interconnect corresponding to the selected word line to the selected word line in the selected block BLK.

The sense amplifier circuit 16 controls operations relating to the columns of the memory cell array 10. In a write operation, the sense amplifier circuit 16 applies a voltage to each bit line provided in the memory cell array 10 in accordance with write data DAT received from the memory controller 2. In a read operation, the sense amplifier circuit 16 determines data stored in a memory cell based on the potential of the corresponding bit line (or whether a current has occurred or not). The sense amplifier circuit 16 transfers data based on a result of the determination to the memory controller 2 as read data DAT.

The memory device 1 is, for example, a NAND flash memory (hereinafter also simply referred to as a "flash memory").

In this case, communication between the memory device 1 and the memory controller 2 is supported by, for example, the NAND interface standard. For the communication between the memory device 1 and the memory controller 2, for example a command latch enable signal CLE, an address latch enable signal ALE, a write enable signal WEn, a read enable signal REn, a ready/busy signal RBn, and an input/output signal IO are used.

The command latch enable signal CLE is a signal indicating that the input/output signal IO received by the memory device 1 is a command CMD. The address latch enable signal ALE is a signal indicating that the signal IO received by the memory device 1 is address information ADD. The write enable signal WEn is a signal instructing the memory device 1 to input therein an input/output signal IO. The read enable signal REn is a signal instructing the memory device 1 to output therefrom an input/output signal IO.

The ready/busy signal RBn is a signal notifying the memory controller 2 of whether the memory device 1 is in a ready state in which the memory device 1 accepts an order from the memory controller 2 or in a busy state in which the memory device 1 does not accept the order. The input/output signal IO is, for example, an 8-bit signal, and may include a command CMD, address information ADD, data DAT, etc.

The memory device 1 and memory controller 2 may constitute a single semiconductor device (memory system or storage device) in combination. Examples of such a semiconductor device include a memory card such as an SD™ card, and a solid state drive (SSD).

In the NAND flash memory 1 of the embodiment, a configuration (control unit) including the memory cell array 10, the row control circuit 15, and the sense amplifier circuit 16 may form a control unit, which is called a "plane". In FIG. 1, an example in which the NAND flash memory 1 includes one plane is shown. However, the NAND flash memory 1 may include two or more planes. The configuration of the plane is not limited to the above-described one, and may be any configuration as long as the plane includes at least the memory cell array 10.

<Circuit Configuration>

FIG. 2 is an equivalent circuit diagram showing an example of the circuit configuration of the memory cell array 10 of the memory device (NAND flash memory) 1 of the embodiment. In FIG. 2, one block BLK of a plurality of blocks BLK included in the memory cell array 10 is shown.

As shown in FIG. 2, the block BLK includes, for example, four string units SU0, SU1, SU2, and SU3. Each string unit SU includes a plurality of memory cell strings (hereinafter referred to as "NAND strings") NS. The NAND strings NS are associated with respective bit lines BL0 to BLm (where m is an integer not less than 1).

The NAND strings NS each include a plurality of memory cells MC0 to MC7 and select transistors ST1 and ST2.

For example, eight memory cells MC are provided in each NAND string NS. The number of memory cells MC in each NAND string NS is not limited to eight.

Each of the select transistors ST1 and ST2 may include, for example, one or more transistors.

Each memory cell (hereinafter also referred to as a "memory cell transistor") MC is a field-effect transistor including a charge storage layer. The memory cell MC can substantially nonvolatilely store 1-or-more-bit data.

The select transistors ST1 and ST2 are each used to select a string unit SU in various operations.

In each NAND string NS, the memory cells MC0 to MC7 are coupled in series between the source of select transistor ST1 and the drain of the select transistor ST2. The control gates of the memory cells MC0 to MC7 in the same block BLK are coupled in common to corresponding word lines WL0 to WL7.

In each NAND string NS, the drain of the select transistor ST1 is coupled to a corresponding bit line BL.

One end of the select transistor ST1 is coupled to one end of a series of memory cells MC0 to MC7, and the other end of the select transistor ST1 is coupled to the corresponding bit line BL.

The gate of the select transistor ST1 is coupled to a corresponding select gate line SGD.

The gates of select transistors ST1 in a string unit SU0 are coupled to a select gate line SGD0. The gates of select transistors ST1 in a string unit SU1 are coupled to a select gate line SGD1. The gates of select transistors ST1 in a string unit SU2 are coupled to a select gate line SGD2. The gates of select transistors ST1 in a string unit SU3 are coupled to a select gate line SGD3.

The sources of select transistors ST2 in the same block BLK are coupled in common to a source line SL. The gates of select transistors ST2 in the same block BLK are coupled in common to a select gate line SGS.

In the above-described circuit configuration of the memory cell array 10, the drains of the select transistors ST1 corresponding to the same column in the respective blocks BLK are coupled to the same bit line BL. The source line SL is, for example, shared by a plurality of blocks BLK.

A plurality of memory cells MC coupled to a common word line WL in one string unit SU are referred to as, for example, a cell unit CU.

For example, when each memory cell MC in the cell unit CU stores 1-bit data, the cell unit CU can store 1-page data, whereas when each memory cell MC in the cell unit CU stores 2-bit data, the cell unit CU can store 2-page data. The "1-page data" is defined by, for example, the total amount of data stored in a cell unit CU constituted by memory cells MC each storing 1-bit data.

The circuit configuration of the memory cell array 10 of the memory device 1 of the embodiment is not limited to the above-described one. For example, the number of memory cells MC, the number of select transistors ST1, and the number of select transistors ST2 in each NAND string NS may be any number. The number of string units SU in each block BLK may be any number.

<Structure Example>

An example of the structure of the memory device (NAND flash memory) of the embodiment will be described with reference to FIGS. 3 to 5.

In the NAND flash memory 1 of the embodiment, the memory cell array 10 is provided above a surface 9 of a semiconductor substrate with respect to a direction (Z direction) perpendicular to the surface (X-Y plane, top surface) of the semiconductor substrate.

In the drawings to be referred to below, the X direction corresponds to a direction in which the word lines WL extend, the Y direction corresponds to a direction in which the bit lines BL extend, and the Z direction corresponds to a direction perpendicular to the top surface of the semiconductor substrate 9 where the flash memory 1 is formed.

In the cross-sectional views to be referred to below, constituent elements such as insulating layers (interlayer insulating films), interconnects, and contacts are omitted as appropriate for better clarity and simplification of the drawings.

Hereinafter, dimensions of each constituent element and dimensional ratios between constituent elements are not limited to those shown in the drawings. The dimensions of each constituent element and dimensional ratios between constituent elements are enlarged or reduced for better clarity and simplification of the drawings.

(Structure of Chip)

FIG. 3 is a top view showing a plane layout of a chip of the NAND flash memory of the embodiment.

As shown in FIG. 3, the chip (substrate) 9 of the NAND flash memory includes an area (hereinafter referred to as a "chip area" or "circuit area") A1, where circuits constituting the flash memory are provided, and an area (hereinafter referred to as a "mark area") A2, where various marks are provided.

The chip area A1 is provided at the center of the chip (semiconductor substrate, semiconductor region) 9. In the chip area A1, a plurality of elements constituting circuits of the flash memory are provided. For example, a layer stack 300 including a plurality of layers is provided in the chip area A1.

The layer stack 300 includes a memory cell array 10. A plurality of memory cells MC are provided in the memory cell array 10 of the layer stack 300.

At an end of the layer stack 300 with respect to a direction parallel to the surface of the substrate 9, a staircase-pattern structure (hereinafter referred to as a staircase structure) is provided.

A plurality of mark areas A2 are provided around the chip area A1. The mark areas A2 are provided between the chip area A1 and the respective ends of the chip 9. The mark areas A2 are provided in dicing areas (dicing lines) 999 used when the chip 9 is cut out from a wafer.

Each mark area A2 includes one or more layer stacks 200. Each layer stack 200 includes a plurality of layers made of different materials. For example, a staircase structure is provided at an end of the layer stack 200.

A mark portion 5 is provided in the layer stack 200. The mark portion 5 is a mark for various measurements used in manufacturing processes of the NAND flash memory.

In each mark area A2, a separator (hereinafter also referred to as a "buried portion") 3 is provided between regions where the mark portions 5 are respectively provided (hereinafter referred to as "mark arrangement regions").

Accordingly, a plurality of layer stacks 200 are separated into regions where the mark portions 5 are respectively provided.

Note that the mark portions 5 and layer stacks 200 may respectively be provided in the regions AX in the four corners of the chip 9.

A structure example of the NAND flash memory of the present embodiment will be described with reference to FIGS. 4 to 6.

Figure 4:
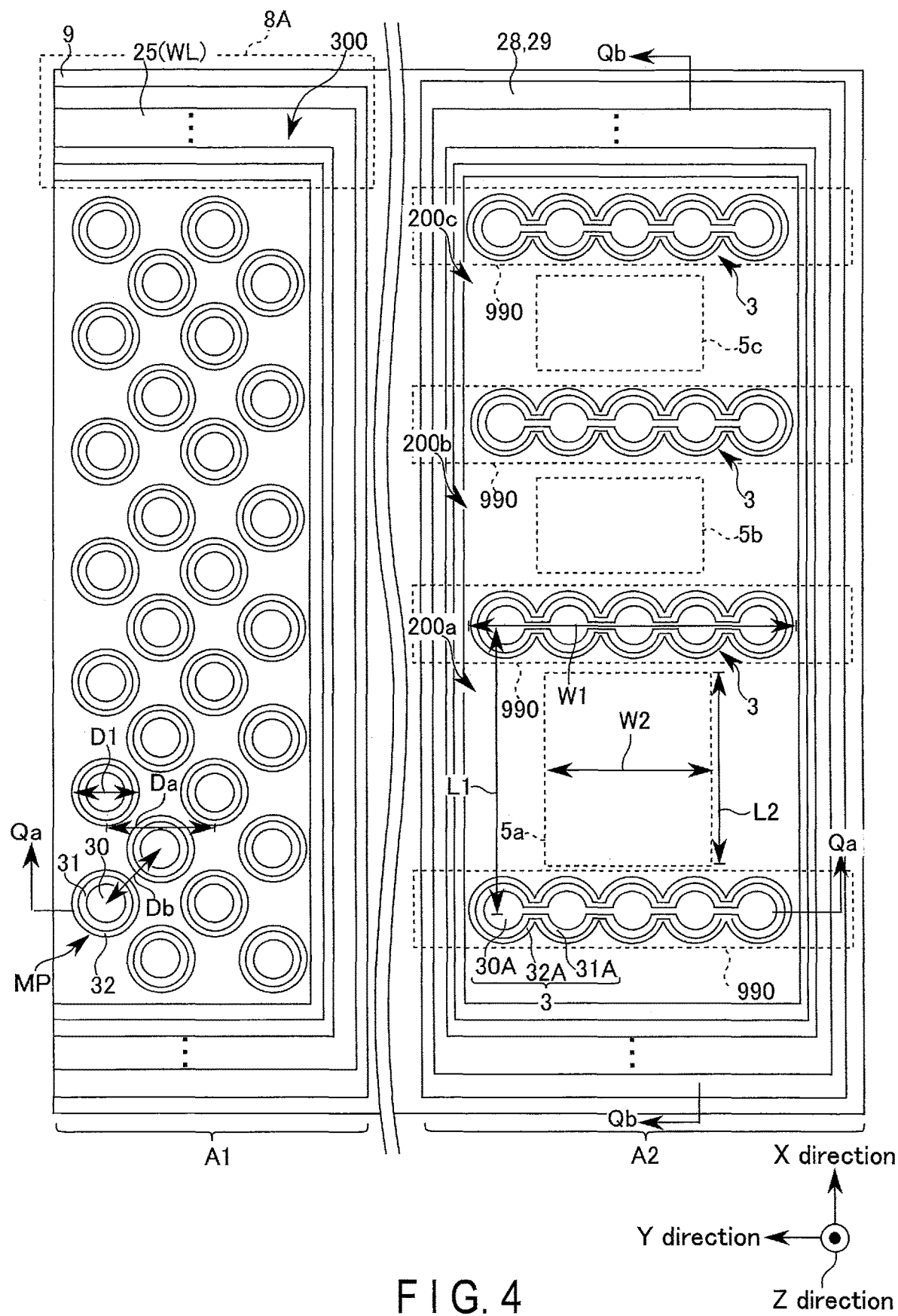
FIG. 4 is a top view showing a structure example of the memory device of the embodiment.

FIG. 4 is a schematic top view for explaining a plane structure of the chip area and mark area of the flash memory of the present embodiment. FIG. 5 is a schematic cross-sectional view for explaining a cross-sectional structure of the chip area and mark area of the flash memory of the present embodiment. FIG. 6 is a schematic cross-sectional view for explaining a cross-sectional structure of the mark area of the flash memory of the present embodiment. FIG. 5 corresponds to a cross section taken along line Qa-Qa in FIG. 4. FIG. 6 corresponds to a cross section taken along line Qb-Qb in FIG. 4.

Figure 5:
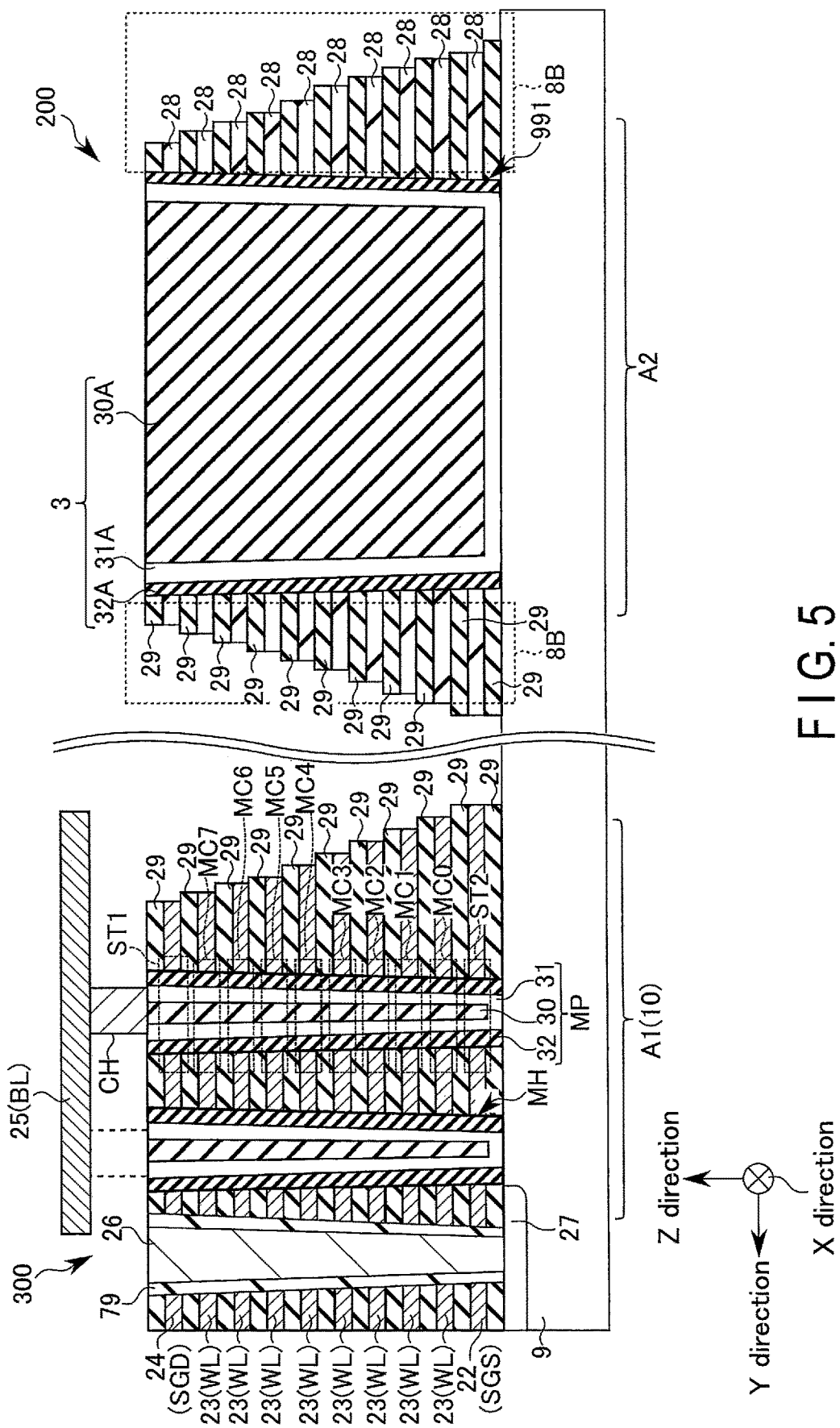
FIGS. 5 and 6 are cross-sectional views each showing a structure example of the memory device of the embodiment.
Figure 6:
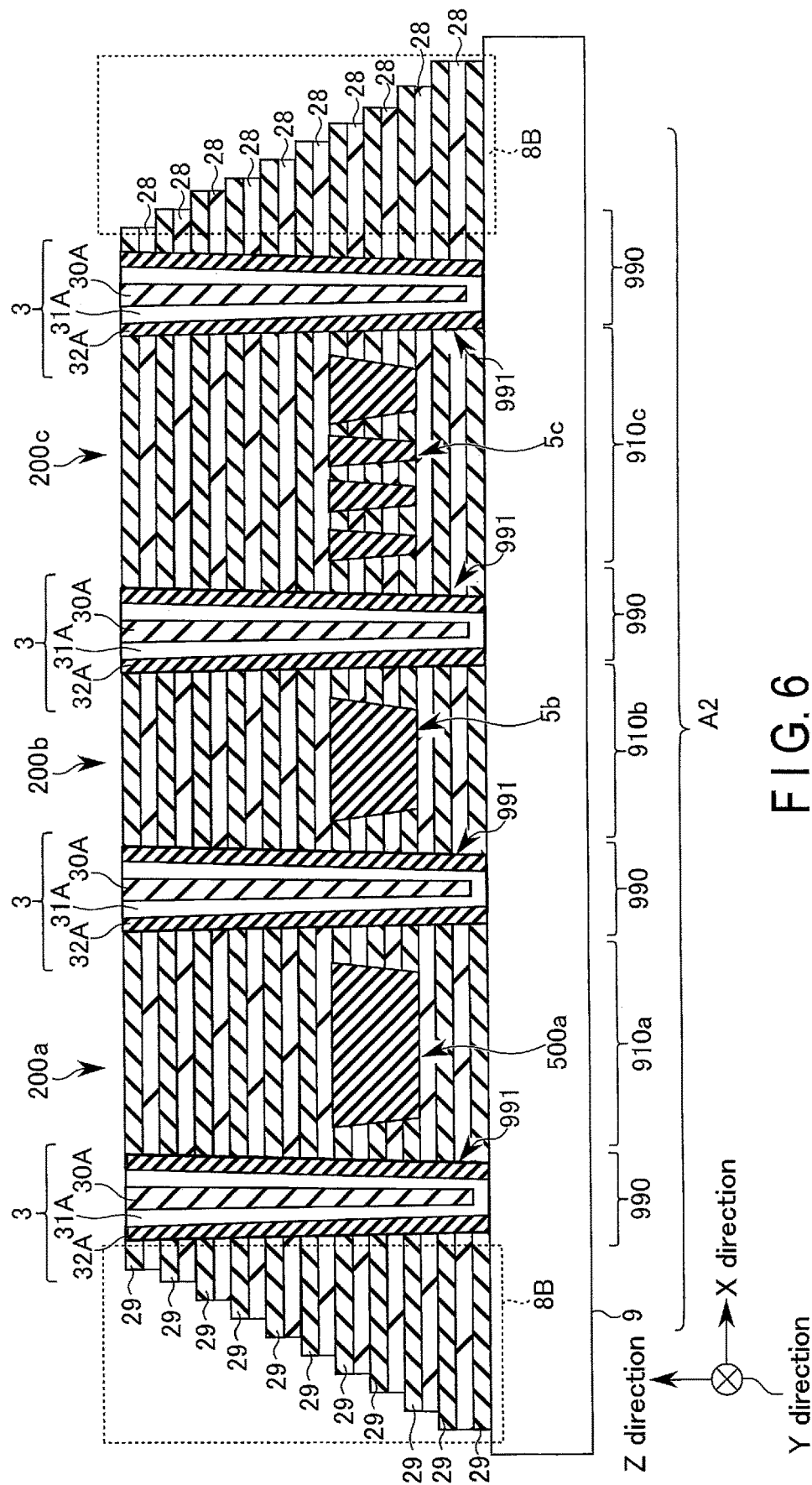

In FIGS. 4 to 6, part of the chip area and mark area of the flash memory of the present embodiment is shown. In FIGS. 4 to 6, dimensions of constituent elements and dimensional rations between constituent elements are changed as appropriate for clarification of the constituent elements.

A plurality of memory pillars MP are provided in the memory cell array 10. For example, the memory pillars MP are laid out in a staggered pattern in the memory cell array 10. Each memory pillar MP has a circular-columnar (or elliptic-columnar) structure. For example, one memory pillar MP is used for one NAND string NS.

A set of memory pillars MP in a region corresponds to one string unit SU.

The string units SU extend in the X direction. The string units SU are aligned in the Y direction.

For example, a hookup region (not shown) is provided in a staircase structure 8A of the layer stack 300. The hookup region is a region in which a plurality of contact plugs are provided. The contact plugs in the hookup region electrically couple the selection gate lines SGD and SGS and word lines WL coupled to the NAND string NS and the interconnects coupled to the memory cell array 10 to a CMOS circuit. For example, the CMOS circuit is provided in a region overlapping the memory cell array 10 in the Z direction, or a region on the same X-Y plane as the memory cell array 10.

For example, a dummy cell may be provided in the memory cell array 10. The dummy cell has substantially the same structure as the memory cell. The dummy cell is formed of a dummy pillar. The dummy pillar has substantially the same structure as the memory pillar MP. The dummy cell is not used for storing data.

Conductive layers 22, 23, and 24 are stacked above the semiconductor substrate 9 in the Z direction.

A conductive layer 22 is provided on the substrate 9 with an insulator layer 29 interposed therebetween. The conductive layer 22 has, for example, a plate-shaped structure expanding along the X-Y plane. The conductive layer 22 functions as a select gate line SGS. The conductive layer 22 is, for example, a metal layer (such as a tungsten layer or a layer including tungsten).

A plurality of conductive layers 23 are provided above the conductive layer 22. A conductive layer 23 and an insulating layer 29 are alternately stacked on the conductive layer 22 in the Z direction. The conductive layer 23 has, for example, a plate-shaped structure expanding along the X-Y plane. A plurality of stacked conductive layers 23 are used as word lines WL0 to WL7 in order from the semiconductor substrate 9 side. The conductive layer 23 is, for example, a metal layer (such as a tungsten layer or a layer including tungsten).

One or more conductive layers 24 are provided above the uppermost conductive layer 23 (the conductive layer 23 furthest from the semiconductor substrate). A conductive layer 24 and an insulating layer 29 are alternately stacked on the uppermost conductive layer 23 in the Z direction. The conductive layer 24 has, for example, a plate-shaped structure expanding along the X-Y plane. The conductive layer 24 is, for example, a metal layer (such as a tungsten layer or a layer including tungsten).

The conductive layers 22, 23, and 24 may be, for example, a conductive polysilicon layer.

Accordingly, the layer stack 300 is a structure including the conductive layers 22, 23, and 24 and insulating layers. The number of layers (number of stacked layers) included in the layer stack 300 (and layer stack 200) is set in accordance with the number of memory cells included in the memory cell array and the number of word lines.

A conductive layer 25 is provided above the conductive layer 24 with respect to the Z direction with an insulating layer (not shown) interposed therebetween. The conductive layer 25 has, for example, a linear structure extending in the Y direction. The conductive layer 25 is used as a bit line BL. A plurality of conductive layers 25 are aligned in the X direction (depth direction or frontward direction in the drawing). The conductive layer 25 is, for example, a metal layer (for example, copper (Cu)).

A source line contact 26 has a plate-shaped (or columnar) structure extending in the X direction and the Z direction. The source line contact 26 passes through the layer stack 300. The source line contact 26 is in contact with a diffusion layer (impurity semiconductor layer) 27 in the substrate 9. The source line contact 26 is coupled to the source line SL in a region in the memory cell array 10.

An insulating layer 79 is provided between the source line contact 26 and the layer stack 300 (layers 22, 23, 24, and 29). The source line contact 26 is thereby isolated from the conductive layers 22, 23, and 24.

A memory pillar MP has a columnar structure extending in the Z direction. The memory pillar MP passes through the layer stack 300 (stacked layers 22, 23, 24, and 29).

For example, the Z-directional upper end of the memory pillar MP is arranged in a region between the region (level) where the conductive layer 24 is provided and the region where the conductive layer 25 is provided with respect to the Z direction. The Z-directional lower end of the memory pillar MP is in contact with the substrate 9 (well region).

The lower end of the memory pillar MP is an end of the memory pillar on the semiconductor substrate 9 side with respect to the Z direction, and the upper end of the memory pillar MP is an end opposite to the lower end of the memory pillar MP with respect to the Z direction.

The side surface of the memory pillar MP (surface of the memory pillar MP extending in the Z direction) faces the conductive layers 22, 23, and 24 (and insulating layers).

The memory pillar MP includes, for example, a core layer 30, a semiconductor layer (conductive layer) 31, and a memory layer 32.

The core layer 30 has a columnar structure extending in the Z direction. For example, the upper end of the core layer 30 is arranged in a region between the region where the uppermost conductive layer 24 is provided and the region where the conductive layer 25 is provided. The lower end of the core layer 30 is in contact with the semiconductor layer 31. The core layer 30 includes an insulator, such as silicon dioxide ($SiO_2$).

The semiconductor layer 31 is provided between the core layer 30 and the memory layer 32. The semiconductor layer 31 is provided between the lower end of the core layer 30 and the top surface of the substrate 9. The semiconductor layer 31 includes a portion in direct contact with the substrate 9. The semiconductor layer 31 is thereby electrically coupled to the semiconductor substrate 9.

For example, the semiconductor layer 31 covers the core layer 30. The side surface of the semiconductor layer 31 is covered with the memory layer 32. The upper end of the core member 30 need not be covered with the semiconductor layer 31.

The semiconductor layer (hereinafter also referred to as a "conductive layer") 31 is, for example, a layer including silicon (such as a polysilicon layer or an amorphous silicon layer).

The memory layer 32 is provided between the layer stack 300 and the semiconductor layer 31. The side surface of the memory layer 32 (surface extending in the Z direction) faces the conductive layers 22, 23, and 24.

The memory layer 32 is a laminated film including a plurality of layers. The structure of the memory layer 32 will be described with reference to FIG. 7.

FIG. 7 shows an example of a cross-sectional structure of the memory pillar on a cross section parallel to the top surface of the semiconductor substrate 9.

As shown in FIG. 7, the memory pillar MP has a circular (or elliptic) plane shape.

In a region including a conductive layer (word line) 23, the core layer 30 is provided in a central part of the memory pillar MP. The semiconductor layer 31 is provided between the side surface of the core layer 30 and the memory layer 32. The memory layer 32 is provided between the side surface of the semiconductor layer 31 and the conductive layer 23. The memory layer 32 includes, for example, an insulating layer 321, a charge storage layer 322, and an insulating layer 323.

The charge storage layer 322 is provided between the two insulating layers 321 and 323. The charge storage layer 322 covers the side surfaces of the insulating layers 321 and 323.

An amount of charge corresponding to data to be stored is stored in the charge storage layer 322. For example, a charge trap film (such as a silicon nitride film) including a trap level is used as the charge storage layer 322. In the charge storage layer 322 using a charge trap film, charge is trapped by the trap level in the charge storage layer 322. In accordance with the amount of charge in the charge storage layer 322, the magnitude of the threshold voltage of the memory cell MC changes.

The insulating layer (hereinafter also referred to as a "block insulating layer") 321 is provided between the charge storage layer 322 and the conductive layer 23. The block insulating layer 321 covers the side surface of the charge storage layer 322. The block insulating layer 321 is in contact with the conductive layer 23.

The block insulating layer 321 serves as a potential barrier and suppresses movement of electrons between the charge storage layer 322 and the conductive layer 23. For example, an insulating oxide layer (such as an aluminum oxide film) is used as the block insulating layer 321.

The insulating layer (hereinafter also referred to as a "gate insulating layer" or a "tunnel insulating layer") 323 is provided between the semiconductor layer 31 and the charge storage layer 322. The gate insulating layer 323 covers the side surface of the semiconductor layer 31. The gate insulating layer 323 is in contact with the semiconductor layer 31.

The gate insulating layer 323 functions as a gate insulating layer of the memory cells MC. The gate insulating layer 323 functions as a tunnel barrier between the charge storage layer 322 and the semiconductor layer 31. For example, an insulating oxide layer (such as silicon oxide film) is used as the gate insulating layer 323.

The layers 321, 322, and 323 are each continuous between a Z-directional upper part to bottom part of the layer stack 300. The layers 321, 322, and 323 are provided between the layer stack 300 and the semiconductor layer 31 in a hole formed in the layer stack 300.

Referring back to FIGS. 4 to 6, regarding the relationship between the memory pillar MP and the NAND string NS, a select transistor ST2 is provided in a portion where the memory pillar MP faces the conductive layer 22. Memory cells MC are provided in respective portions where the memory pillar MP faces the conductive layers 23. A select transistor ST1 is provided in a portion where the memory pillar MP faces the conductive layer 24.

The semiconductor layer 31 included in the memory pillar MP functions as the channel region of each of the memory cells MC and the select transistors ST1 and ST2.

A contact plug CH is provided between the memory pillar MP and the conductive layer 25. The contact plug CH is, for example, a metal layer. The upper end of the contact plug CH is in contact with one conductive layer 25 (bit line BL). The lower end of the contact plug CH is in contact with the upper end of the semiconductor layer 31. The bit line BL is thereby electrically coupled to the NAND string NS (memory pillar MP). Memory pillars MP adjacent to each other in the Y direction are coupled to different bit lines BL.

As shown in FIGS. 4, 5, and 6, a plurality of layer stacks 200 (200a, 200b, and 200c) are provided on the top surface of the substrate 9 in the mark area A2.

In the example of FIGS. 4, 5, and 6, a plurality of layer stacks 200a, 200b, and 200c aligned in the X direction are shown. Note that a plurality of layer stacks 200 are aligned also in the Y direction in the substrate (chip) 9.

Each layer stack 200 includes a plurality of first layers 29 and a plurality of second layers 28. In the layer stack 200, a first layer 29 and a second layer 28 are alternately stacked in the Z direction. For example, the first layer 29 is a silicon oxide layer, and the second layer 28 is a silicon nitride layer.

For example, an X-directional or Y-directional end of the layer stack 200 has a staircase structure 8B. A plurality of layer stacks 200 may be connected via staircase structures 8B.

A plurality of layer stacks 200 are aligned in extending directions (longitudinal directions) of the mark areas (dicing areas).

A mark portion 5 is provided in each layer stack 200. For example, the mark portion 5 is buried in the layer stack 200. The mark portion 5 is surrounded by the insulating layers 28 and 29. Note that the mark portion 5 may be provided on the substrate (semiconductor region) 9 below the layer stack 200 with respect to the Z direction, or in the substrate 9.

The mark portion 5 is, for example, a measurement mark, a dimension management mark, a film thickness management pattern, or a test element group. The measurement mark is, for example, an alignment measurement mark for lithography, or an inspection mark for overlay.

For example, the mark portion 5 includes an insulator, a semiconductor, or a conductor. In the example of FIG. 6, a mark portion 5 constituted by an insulator is shown. Note, however, that the mark portion 5 may be formed of a conductor or a semiconductor.

The structure and layout of the mark portion are not limited to those in the example of FIGS. 4, 5, and 6. The structure and layout of the mark portion may be changed as appropriate for the intended purpose of the mark portion or for distinction between mark portions.

A plurality of separators 3 are provided between a plurality of layer stacks 200 (200a, 200b, and 200c).

The separators 3 extends in a direction orthogonal to the direction (the alignment direction of the mark portions) in which the mark area A2 extends when viewed in the Z direction. Each separator 3 passes in the Z direction through a region between two layer stacks 200 aligned in the X direction. The lower end of the separator 3, for example, reaches the top surface of the substrate 9. For example, the upper end of the separator 3 is at the same position as or an upper position than the upper end of the layer stack 200 with respect to the Z direction.

The separator 3 need not completely divide the layer stack 200 as long as it is provided between two mark portions 5. For example, a Y-directional end of the separator 3 is in contact with the staircase structure 8B.

It is desirable to set, in a predetermined value range, a ratio between a distance between two separators 3 provided in a mark area A2 (dimension between separators 3 along the longitudinal direction of the dicing area/layer stack, or dimension of one mark arrangement region between separators 3) L1 and a longitudinal dimension of a separator 3 viewed in the Z direction (dimension of a separator 3 along the width direction of the dicing area/layer stack) W1.

For example, the distance (X-directional dimension in FIGS. 4 to 6) L1 is set in accordance with the size of the mark portion 5. For example, the longitudinal dimension of a mark portion 5 (dimension of the mark portion 5 along the longitudinal direction of the dicing area/layer stack) L2 is a dimension L2 within a range from 30 μm to 165 μm.

The dimension (Y-directional dimension in FIGS. 4 to 6) W1 is preferably larger than the dimension W2 of the mark portion 5 along the width direction of the dicing area.

For example, the width dimension of a mark portion 5 (dimension of the mark portion 5 along the width direction of the dicing line/layer stack) W2 takes, for example, a value within a range from 40 μm to 60 μm.

As a result of dicing of the wafer, a fragment of the mark portion 5 may remain in the mark area A2. Alternatively, the mark portion 5 may be removed from the chip.

In the present embodiment, separators 3 are provided between layer stacks 200 in the mark area A2. For example, a structure is divided into a plurality of portions 200 by arranging the separators 3.

Each separator 3 includes layers 30A, 31A, and 32A. The material of the layer (hereinafter also referred to as a "laminated film") 32A is the same as the material of the memory layer 32. The material of the layer 31A is the same as the material of the semiconductor layer 31. The material of the layer 30A is the same as the material of the insulating layer 30.

The insulating layer 30A has a structure expanding on a Y-Z plane. The insulating layer 30A includes, for example, a plurality of columnar portions (for example, circular-columnar portions) extending in the Z direction, and one or more connection portions each connecting two circular-columnar portions.

The laminated film 32A is provided between the layer stack 200 and the insulating layer 30A. The laminated film 32A is provided on the side surface of the layer stack 200 along the inner wall of each trench 991. The laminated film 32A includes a portion (hereinafter referred to as a cylindrical portion) having an annular plane shape when viewed in the Z direction. The laminated film 32A has a structure in which a plurality of cylindrical portions are connected in an alignment direction of the cylindrical portions.

The semiconductor layer 31A is provided between the laminated film 32A and the insulating layer 30A. Like the laminated film 32A, the semiconductor layer 31A includes a portion (cylindrical portion) having an annular plane shape when viewed in the Z direction. For example, the semiconductor layer 31A includes a plurality of cylindrical portions and connection portions connecting the cylindrical portions.

In the present embodiment, reaction force (stress) that occurs in the layer stacks and mark portions in the mark area A2 is alleviated by the separators 3.

(b) Manufacturing Method

A method of manufacturing the memory device (such as a NAND flash memory) of the present embodiment will be described with reference to FIGS. 8 to 21. FIGS. 3 to 7 will also be referred to as appropriate.

<Manufacturing Method 1>

A first example of the method of manufacturing the memory device of the embodiment will be described with reference to FIGS. 8 to 18.

Figure 8:
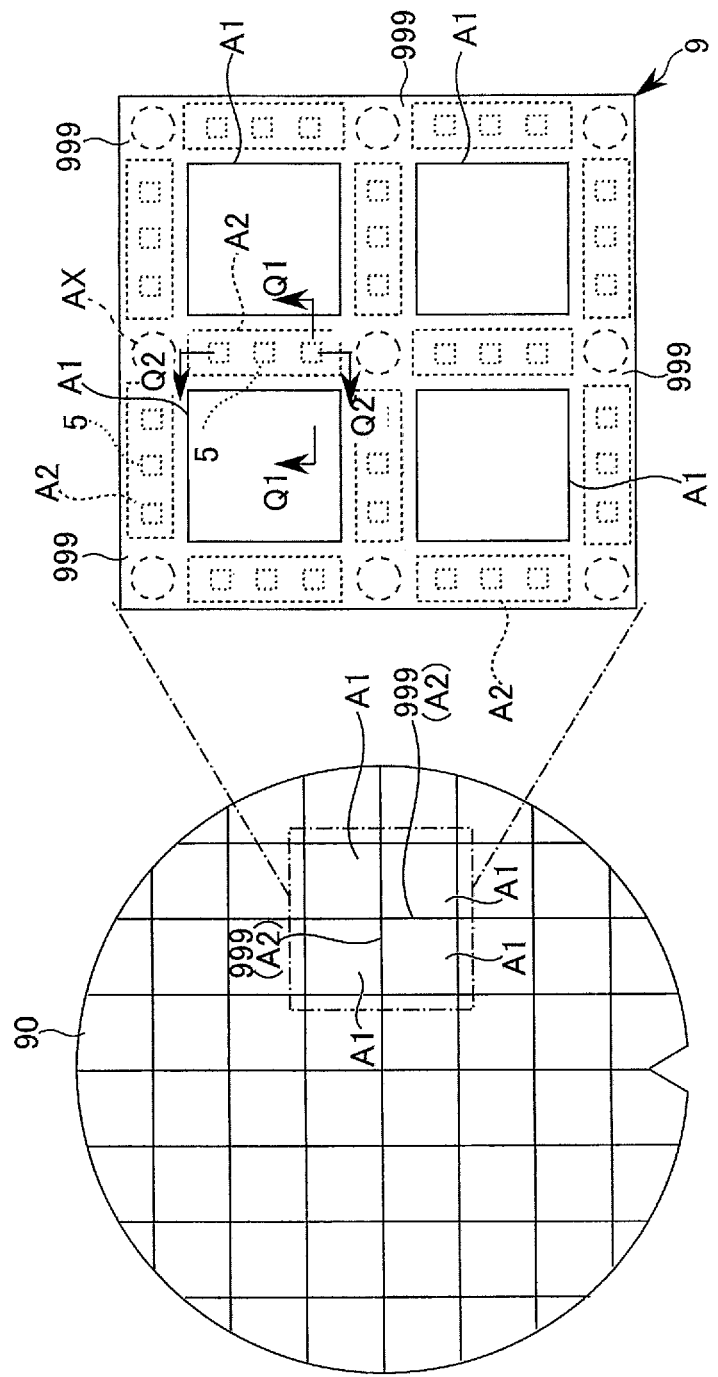
FIG. 8 is a top view showing a process of a method of manufacturing the memory device of the embodiment.
Figure 9:
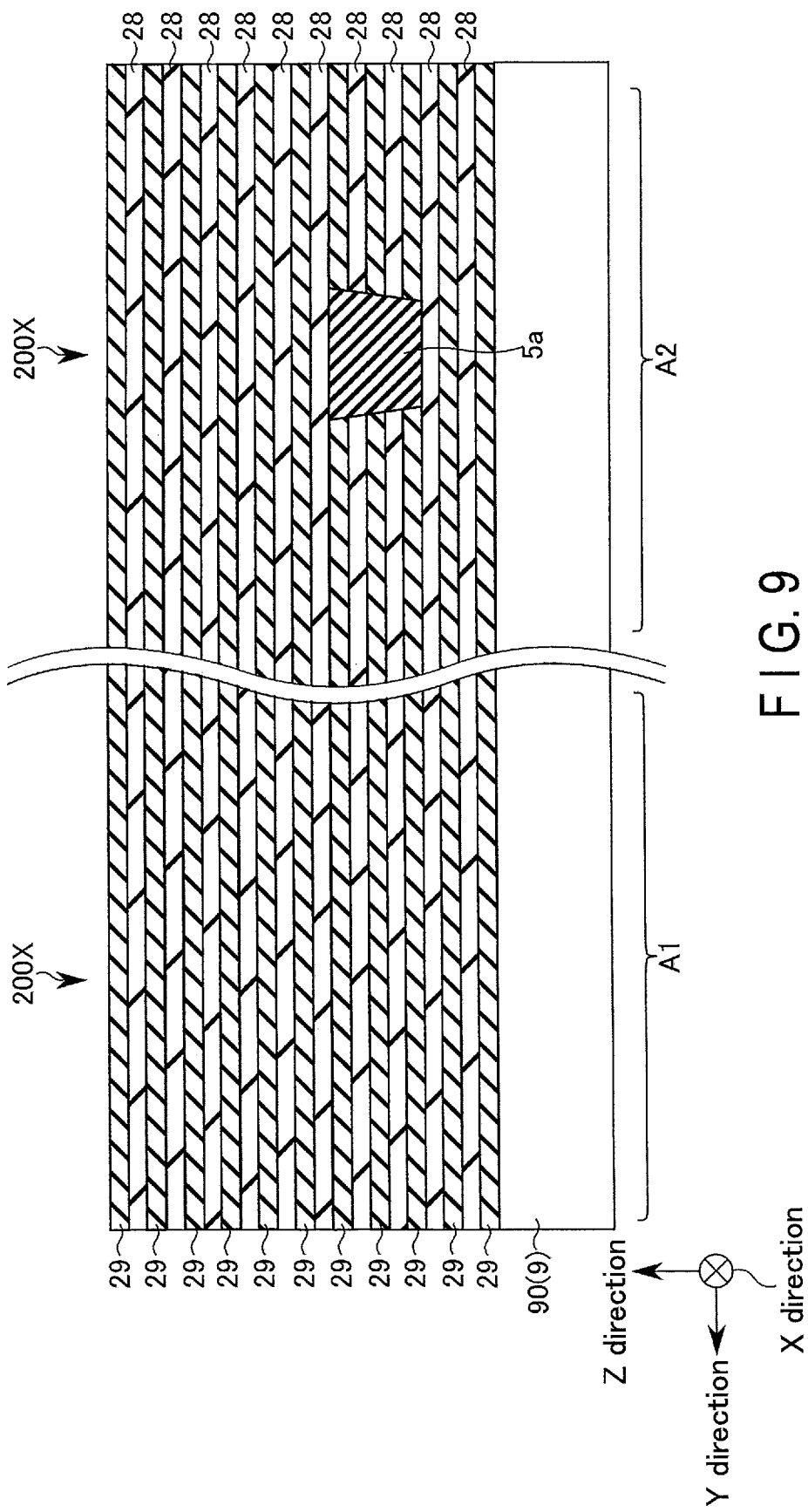
FIGS. 9 and 10 are cross-sectional process charts each showing a process of the method of manufacturing the memory device of the embodiment.
Figure 10:
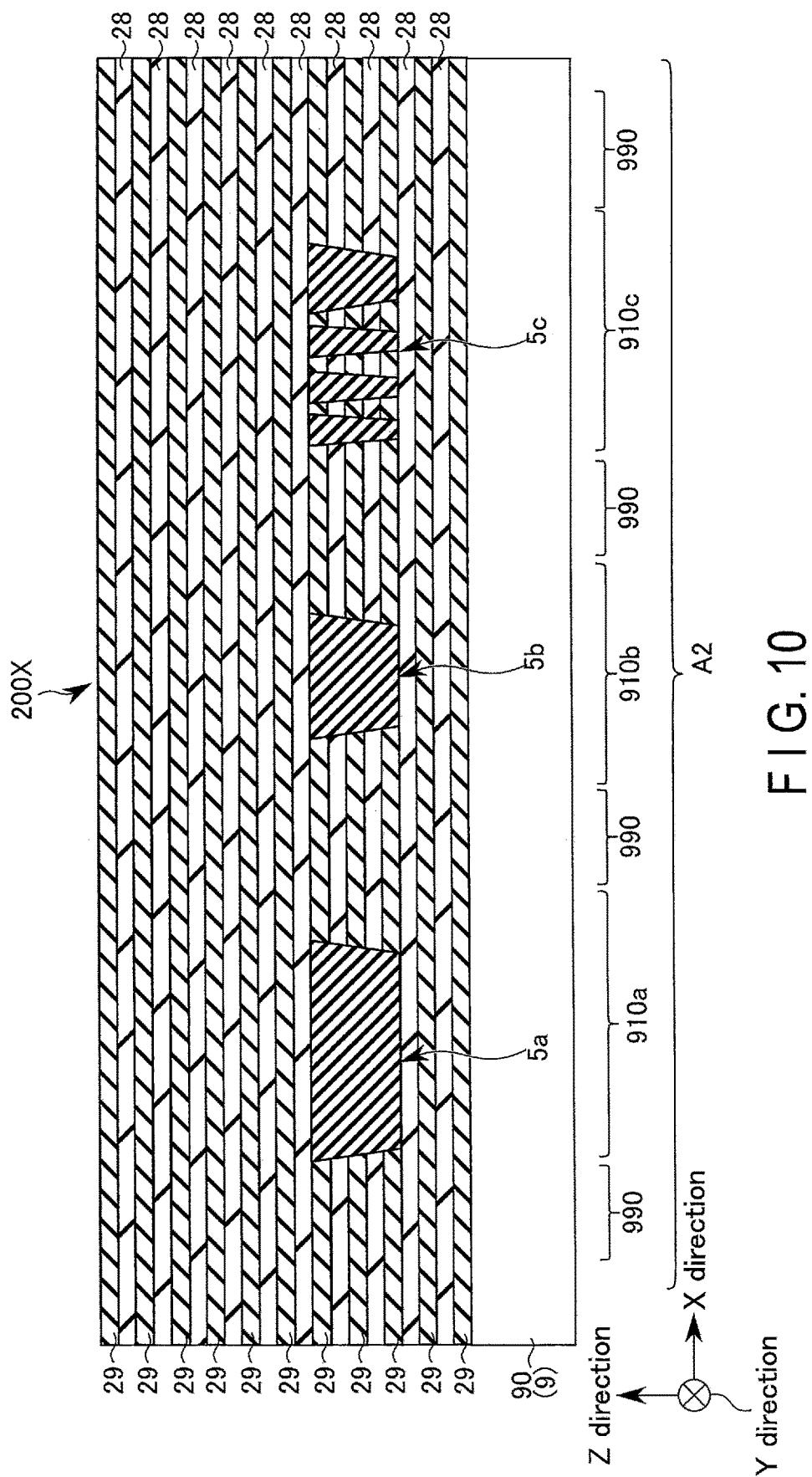

FIG. 8 is a schematic top view for explaining a process in the method of manufacturing the flash memory of the present embodiment. FIGS. 9 and 10 are schematic cross-sectional views for explaining a process in the method of manufacturing the flash memory of the present embodiment. FIG. 9 shows a cross section taken along line Q1-Q1 in FIG. 8. FIG. 10 shows a cross section taken along line Q2-Q2 in FIG. 8. For example, the line Q1-Q1 is parallel to the line Qa-Qa in FIGS. 4 to 6, and the line Q2-Q2 is parallel to the line Qb-Qb in FIGS. 4 to 6.

As shown in FIGS. 8 to 10, impurity semiconductor regions (not shown), such as a well region and a diffusion layer, are formed in a predetermined region in a wafer (such as a silicon wafer) 90 by ion implantation.

A layer stack 200X is formed on the wafer 90 by, for example, chemical vapor deposition (CVD).

A first layer 29 and a second layer 28 are alternately stacked in the Z direction. Accordingly, a structure (layer stack) 200X in which the first layer 29 and the second layer 28 are alternately stacked is formed on the wafer 90. For example, the insulating layer 29 is a silicon oxide layer. The insulating layer (hereinafter also referred to as a "sacrificial layer") 28 is, for example, a silicon nitride layer. As long as a desired etching ratio between the two layers 28 and 29 is secured, the layers 28 and 29 may be made of any materials.

The layer stack 200X covers the chip areas A1 and the mark areas A2 (dicing areas 999) of the wafer 90.

While the layer stack 200X is being formed, various mark portions 5 (5a, 5b, and 5c) are respectively formed in predetermined regions in the mark areas A2 of the dicing areas 999.

For example, when a given number of layers 29 and layers 28 are formed, formation of the layer stack 200X is interrupted. By a known technique, a plurality of mark portions 5 in predetermined shapes are formed in a plurality of regions 910 in the mark areas A2. After formation of the mark portions 5, formation of the layer stack 200X is resumed. The layers 28 and 29 are alternately formed.

Accordingly, the mark portions 5 are formed inside the layer stack 200X.

The mark portions 5 may be formed on the wafer 90 or in the wafer 90 before formation of the layer stack 200X. Mark portions may be provided in the regions AX where dicing areas 999 intersect each other.

Figure 11:
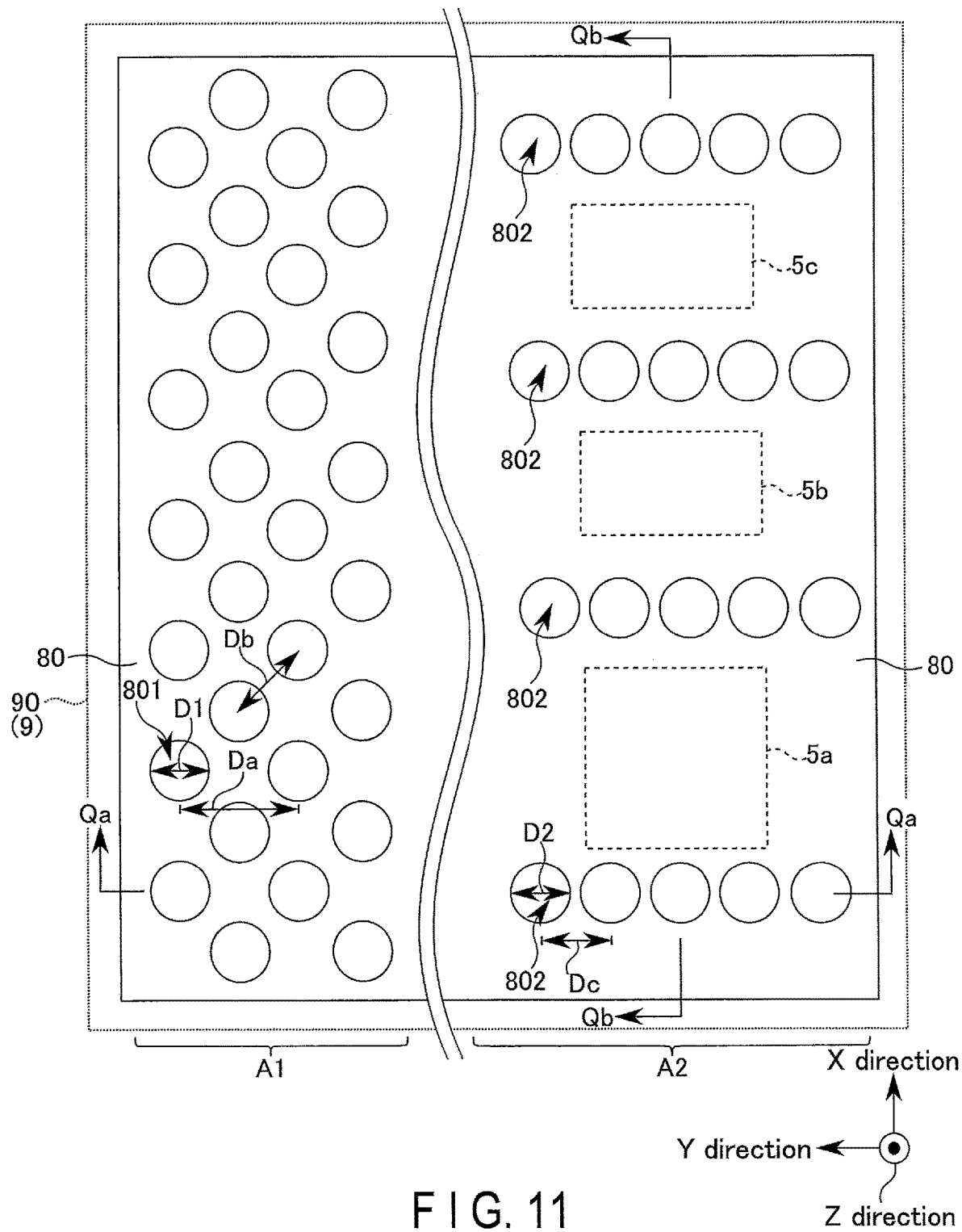
FIG. 11 is a plan view showing a process of the method of manufacturing the memory device of the embodiment.
Figure 12:
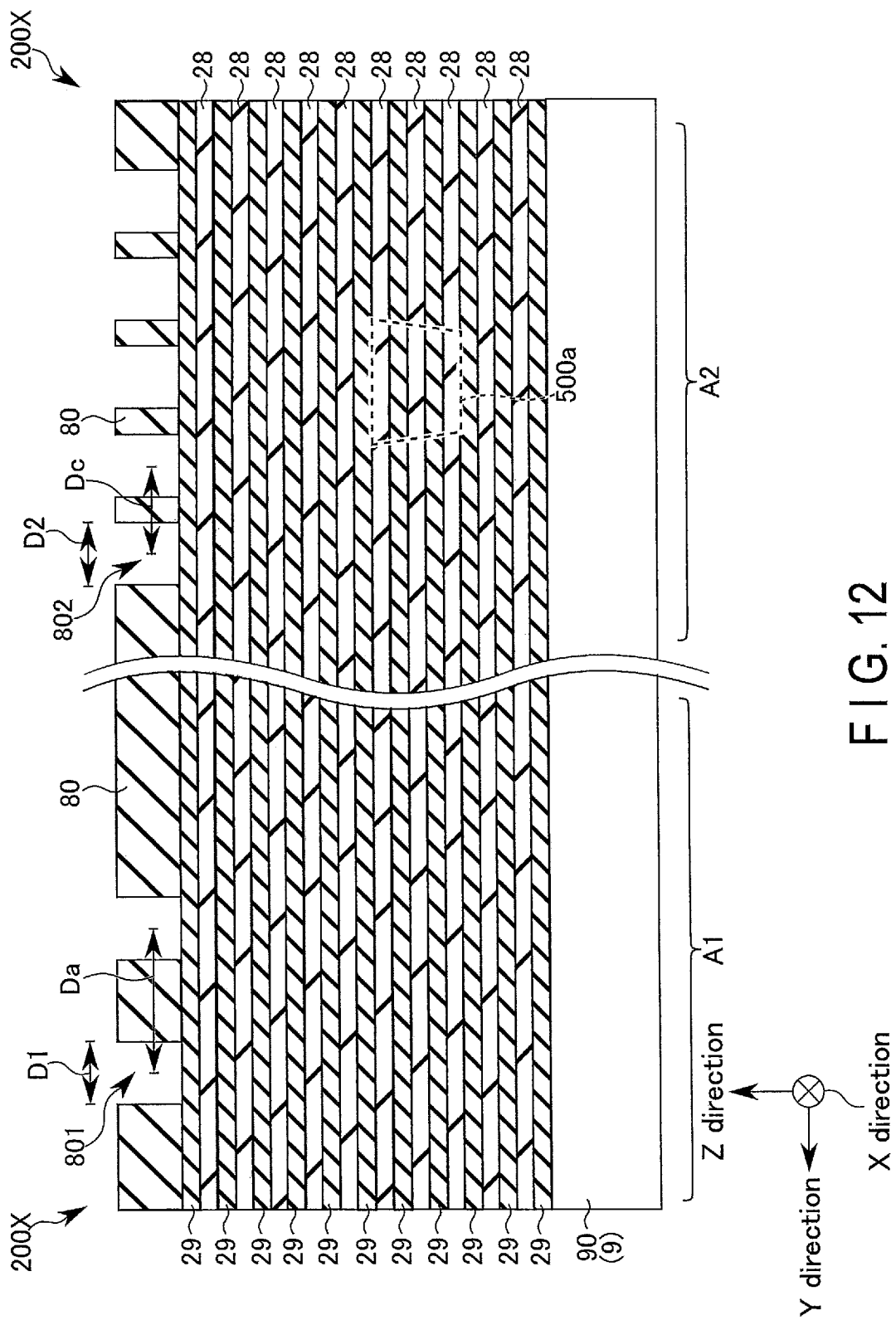
FIGS. 12 and 13 are cross-sectional process charts each showing a process of the method of manufacturing the memory device of the embodiment.
Figure 13:
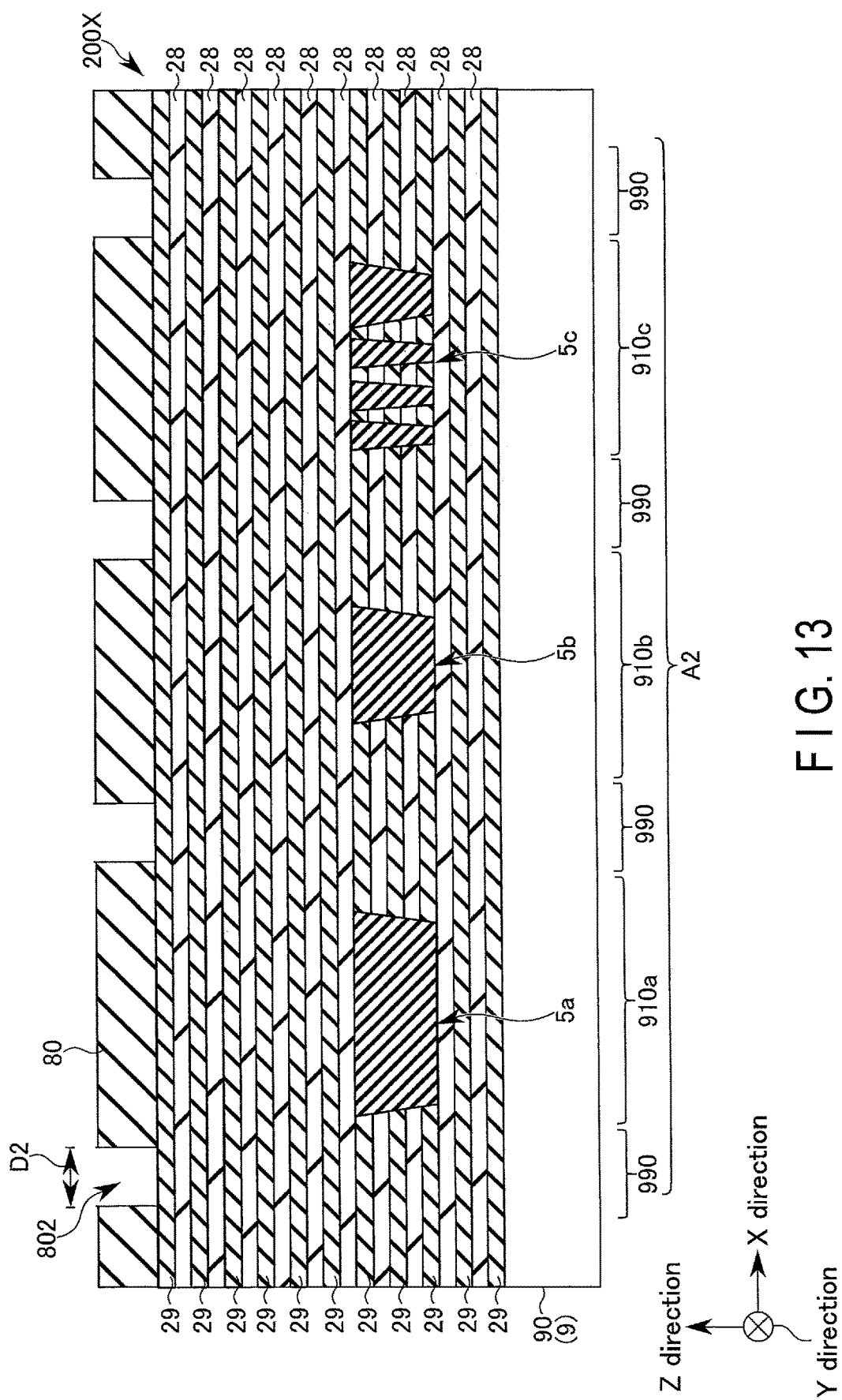

FIG. 11 is a schematic top view for explaining a process in the method of manufacturing the flash memory of the present embodiment. FIGS. 12 and 13 are schematic cross-sectional views for explaining a process in the method of manufacturing the flash memory of the present embodiment. FIG. 12 shows a cross section taken along line Qa-Qa in FIG. 11. FIG. 13 shows a cross section taken along line Qb-Qb in FIG. 11.

As shown in FIGS. 11 to 13, a mask layer (such as a resist mask) 80 having patterns of holes 801 and 802 is formed on the layer stack 200X by photolithography and etching.

Holes (openings) 801 and 802 are formed in the mask layer 80. The holes 801 and 802 each have a circular (or elliptic) plane shape.

For example, lithography for patterning the mask layer 80 is performed by alignment of the mask using mark portions 5.

In the chip area A1, a plurality of holes 801 are formed. The holes 801 are laid out in a region of the chip area A1 in which the memory cell array 10 is formed (hereinafter also referred to as a "memory cell array formation region 10") in a staggered arrangement.

The holes 801 each have a dimension (diameter of the hole 801) D1 in a direction parallel to the X-Y plane of the wafer. The distance between the centers of two holes 801 adjacent to each other in the Y direction (pitch between holes 801) is set to a dimension Da. The distance between the centers of two holes 801 adjacent to each other in the X direction is set to the dimension Da, for example. The distance between the centers of two holes 801 adjacent to each other in a direction diagonal to the X direction and the Y direction is set to a dimension Db.

Simultaneously with the formation of the holes 801 in the chip area A1, holes 802 are formed in the resist mask 80 in the mark area A2.

For example, the holes 802 are formed in regions (hereinafter referred to as separation regions or boundary regions) 990 between regions 910 (910a, 910b, and 910c) in which different marks portions 5a, 5b, and 5c are respectively provided.

The holes 802 each have a dimension (diameter of the hole 802) D2 in a direction parallel to the X-Y plane of the wafer. The dimension D2 is, for example, equal to the dimension D1.

The holes 802 in each separation region 990 are aligned in a direction orthogonal to the alignment direction of the regions 910 (Y direction in the example of FIGS. 11 to 13).

The distance between the centers of two holes 802 adjacent to each other in the Y direction is set to a dimension Dc. The dimension DC is smaller than the dimension Da and the dimension Db.

Figure 14:
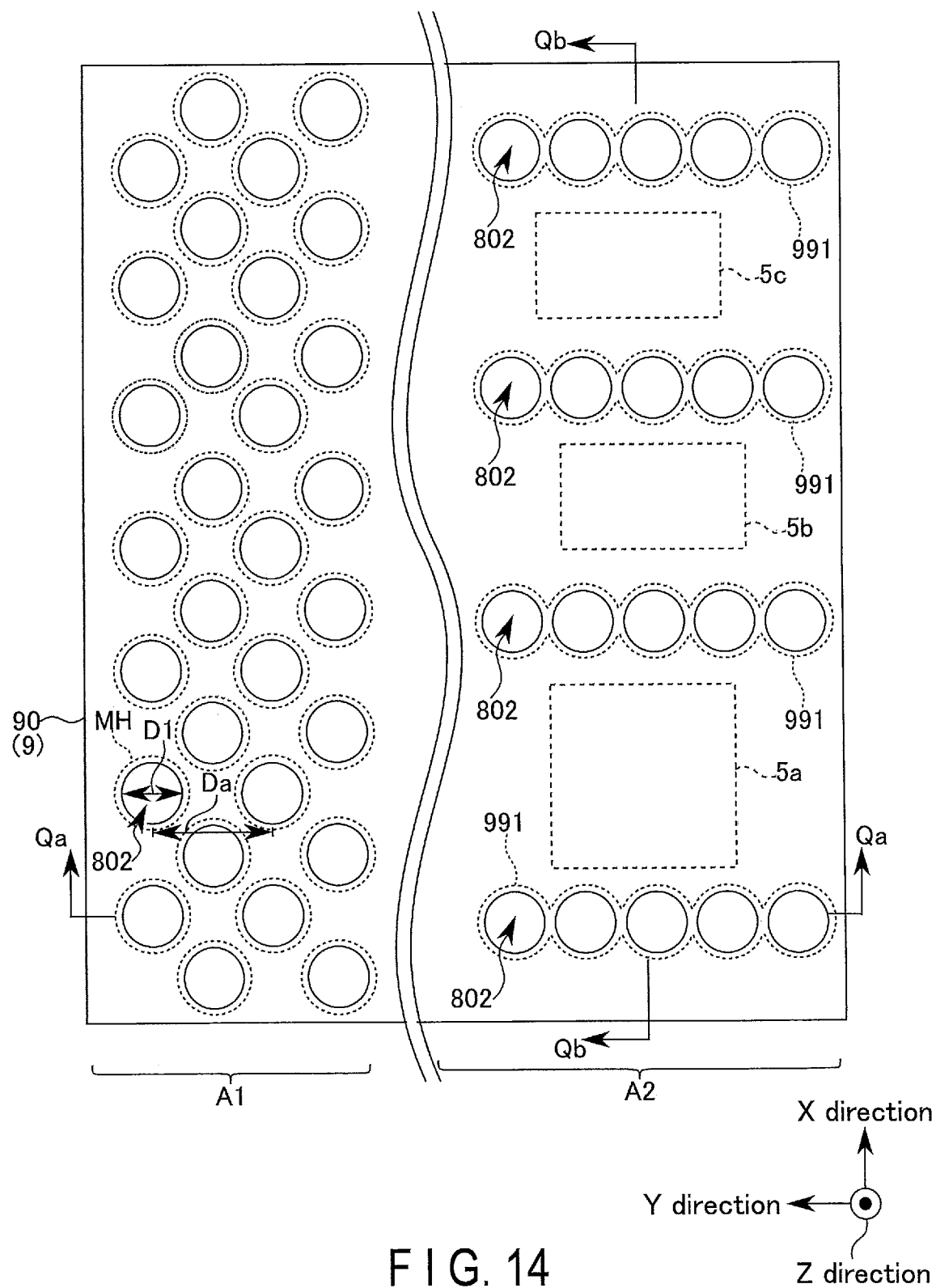
FIG. 14 is a top view showing a process of the method of manufacturing the memory device of the embodiment.
Figure 15:
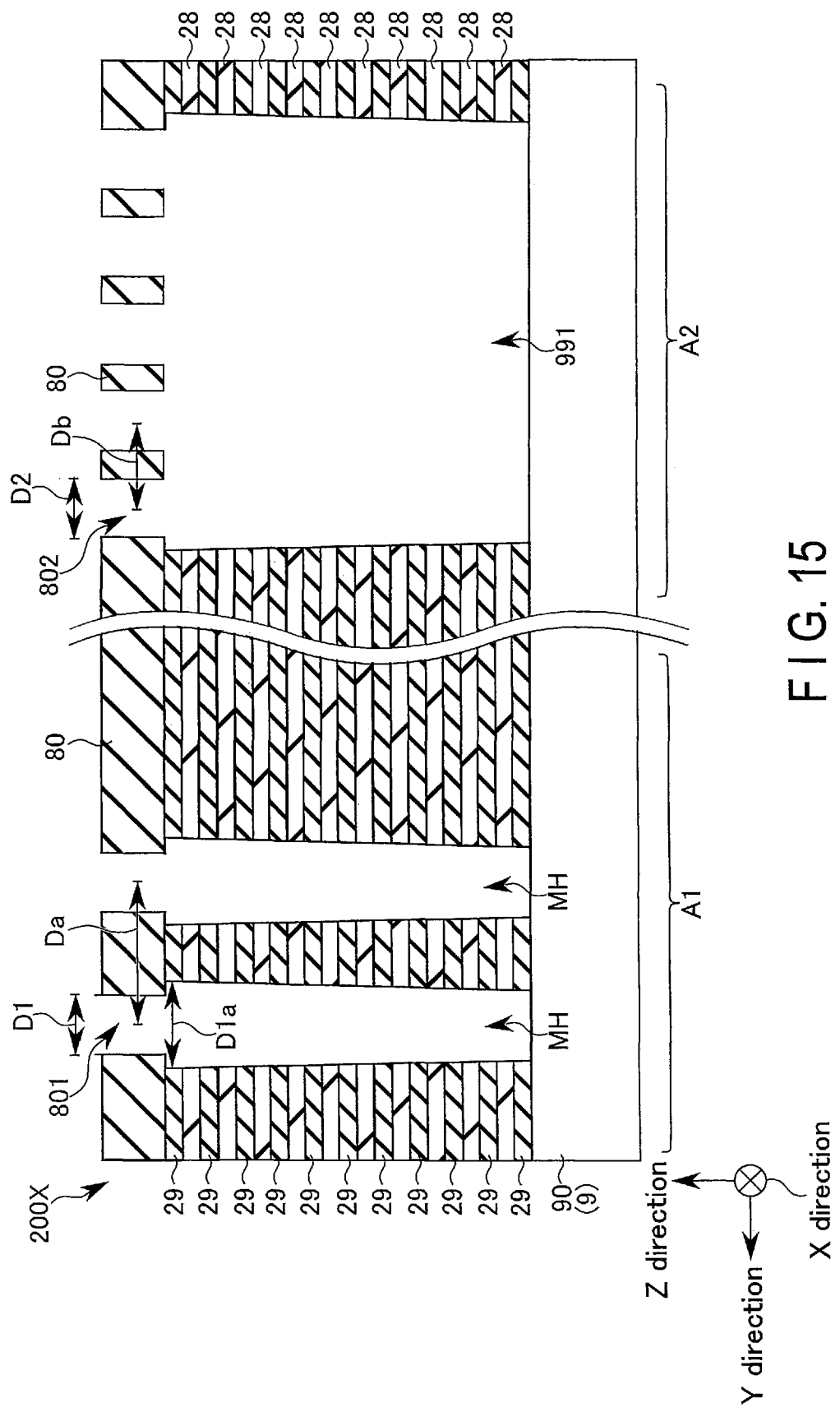
FIGS. 15, 16, 17, 18, 19, 20, and 21 are cross-sectional process charts each showing a process of the method of manufacturing the memory device of the embodiment.
Figure 16:
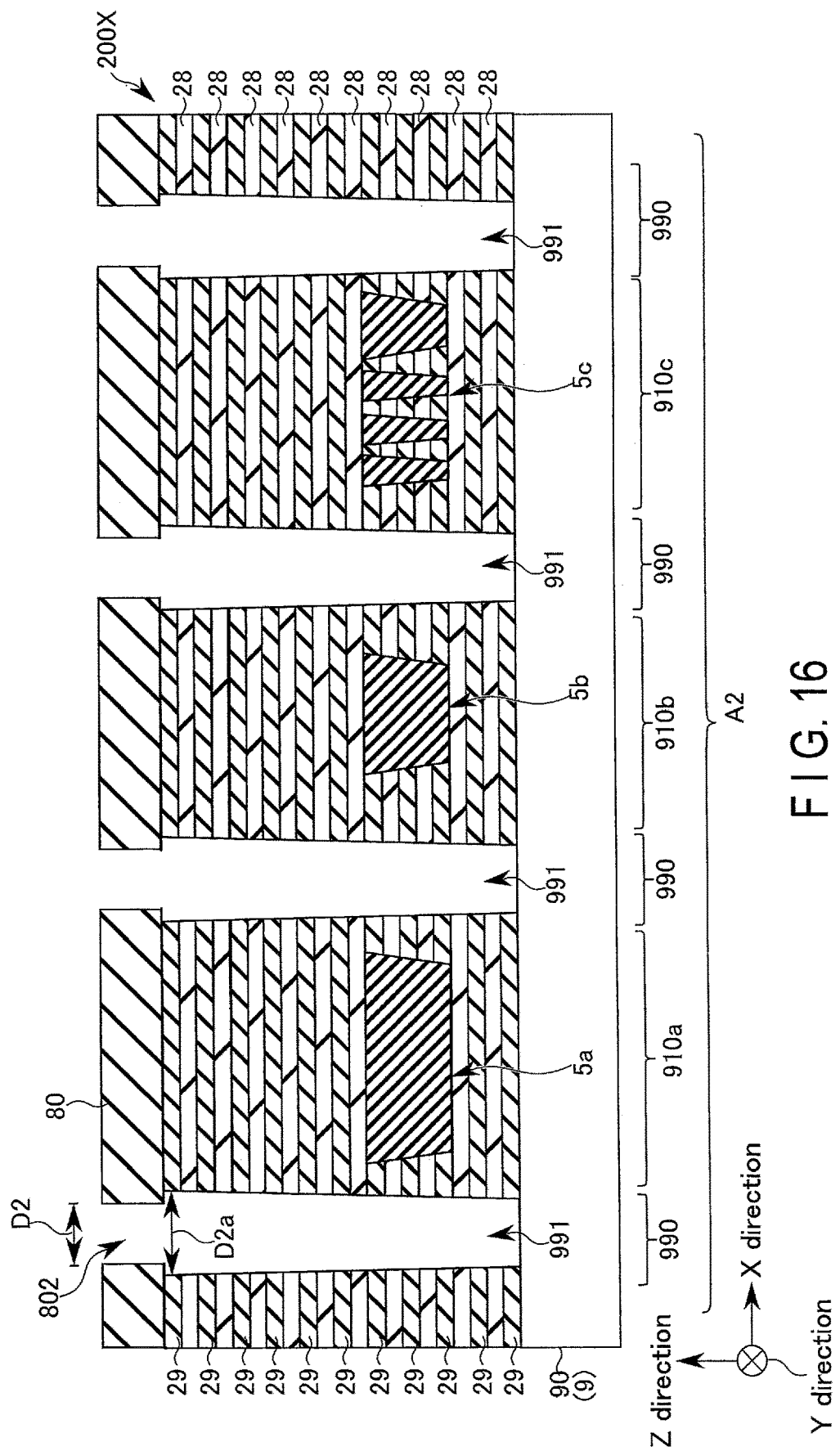

FIG. 14 is a schematic top view for explaining a process in the method of manufacturing the flash memory of the present embodiment. FIGS. 15 and 16 are schematic cross-sectional views for explaining a process in the method of manufacturing the flash memory of the present embodiment. FIG. 15 shows a cross section taken along line Qa-Qa in FIG. 14. FIG. 16 shows a cross section taken along line Qb-Qb in FIG. 14.

As shown in FIGS. 14 to 16, etching is performed on the layer stack 200X based on the patterns of holes 801 and 802 of the resist mask 80.

Memory holes MH are thereby formed in the layer stack in the memory cell array formation region 10. The memory holes MH extend in the Z direction in the layer stack 200X. The bottom of the memory hole MH reaches the top surface of the wafer 90.

In each separation region 990 of the mark area A2, the layer stack 200X is etched in accordance with the pattern of holes 802 simultaneously with the formation of the memory holes MH.

In the present embodiment, the etching condition for forming the memory holes MH is set to cause not only etching in the Z direction, but also etching in a direction parallel to the surface (X-Y plane) of the wafer 90, for example.

The layer stack 200X is subjected to not only the etching in the Z direction, but also the etching in the direction parallel to the surface of the wafer 90.

Accordingly, memory holes MH of a dimension D1a larger than the dimension D1 of the pattern of holes are formed in the memory cell array formation region 10.

As mentioned above, the pitch Dc between the holes 802 in the mark area A2 is smaller than the pitches Da and Db between the holes 801 in the memory cell array formation region 10.

The etching of the layer stack 200X in the direction parallel to the surface of the wafer 90 connect a plurality of holes formed in the layer stack 200X in the separation region 990 to each other in the alignment direction of the holes 802 of the mask layer 80.

As a result, a trench 991 is formed in the separation region 990 of the mark area A2. The trench 991 has a pattern extending in the Y direction. The trench 991 is formed between mark arrangement regions 910 adjacent to each other in the X direction (or Y direction) in the mark area A2.

Accordingly, simultaneously with the formation of the memory holes MH in the chip area A1, the trench 991 extending in the Y direction is formed in the region 990 between mark portions 5 in the mark area A2 (dicing area 999) by etching according to the pattern of holes aligned in the Y direction.

It is desirable that the pitch Db between holes 802 of the resist mask 80 formed in the separation region 990 be set so that the holes formed in the layer stack 200X are connected to one another by the etching in the direction parallel to the surface of the wafer 90.

It is preferable that the dimension D1 of the holes 801 for forming the memory holes MH be set in consideration of the amount of etching caused in the direction parallel to the surface of the wafer 90.

The etching for connecting holes may be performed in a different process from the etching for forming the memory holes MH.

For example, holes having an opening dimension (for example, the dimension D1) are formed in each of the chip area A1 and the mark area (dicing area) A2 by anisotropic etching. Thereafter, etching (such as wet etching) with a condition which enables the members 28 and 29 of the layer stack to be etched in the direction parallel to the surface of the wafer 9 is performed. The memory holes MH and trenches 991 having the shapes shown in FIGS. 14 and 16 are thereby formed in the layer stack 200X.

Figure 17:
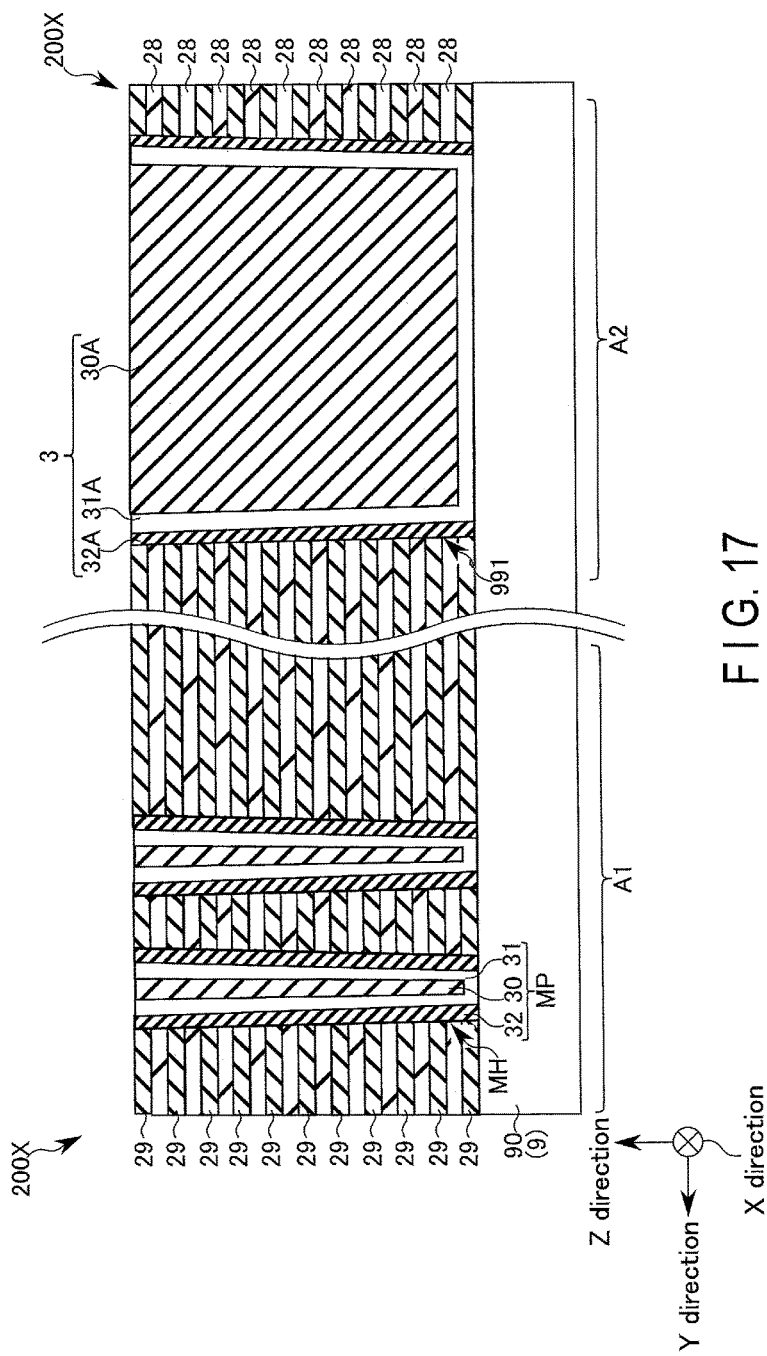
Figure 18:
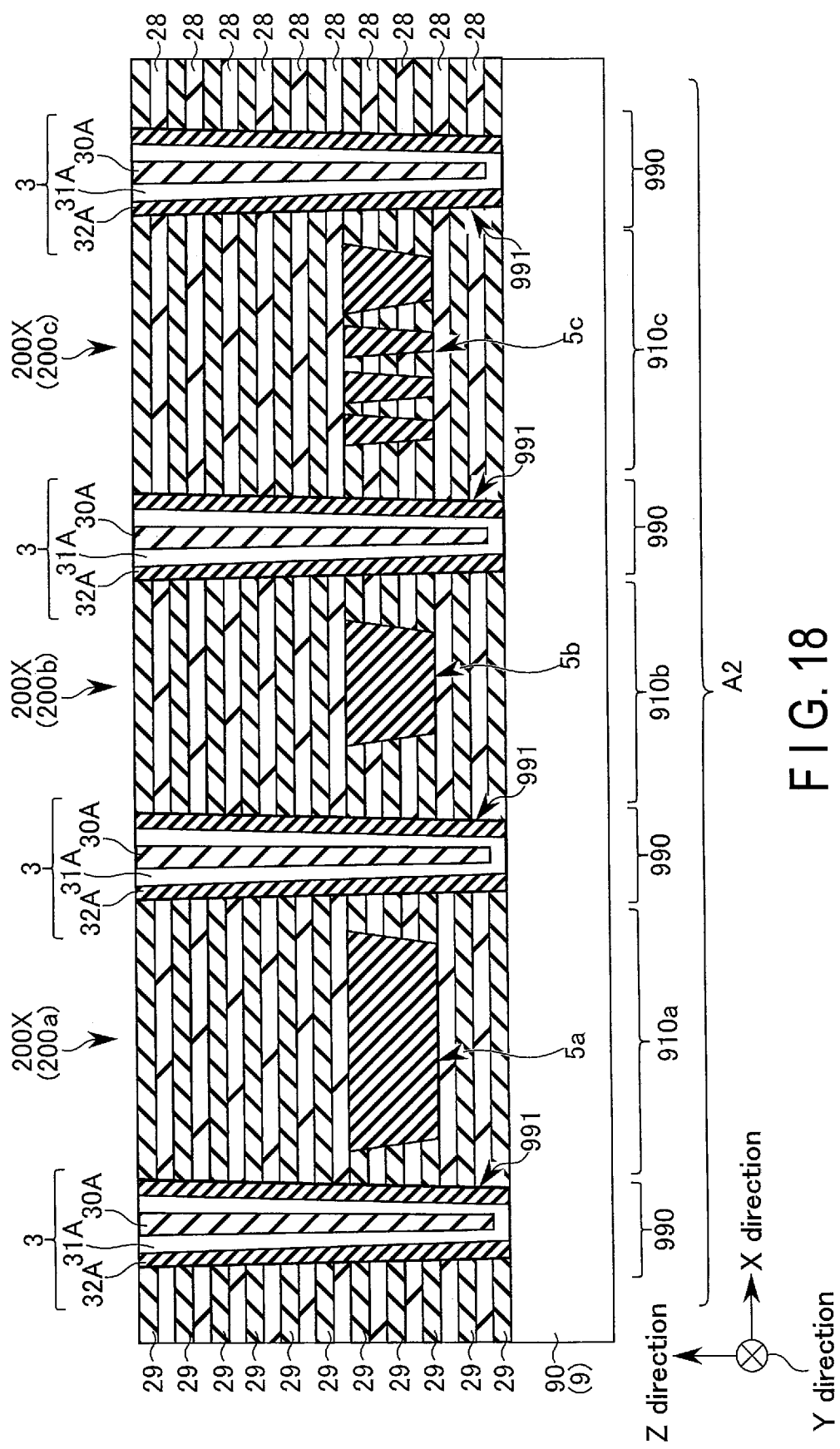

FIGS. 17 and 18 are schematic cross-sectional views for explaining a process in the method of manufacturing the flash memory of the present embodiment. FIG. 17 shows a cross section of the wafer taken along the Y direction. FIG. 18 shows a cross section of the wafer taken along the X direction.

As shown in FIGS. 17 and 18, a memory layer 32 is formed on the layer stack 200X by, for example, CVD. As described above (see, for example, FIG. 7), the memory layer 32 is a laminated film including three layers. In this case, after a block insulating layer 321 is formed, a charge storage layer 322 is formed on the block insulating layer 321. After the charge storage layer 322 is formed, a gate insulating layer 323 is formed on the charge storage layer 322.

In each memory hole MH, the memory layer 32 is formed on the side surfaces of the insulating layers 28 and 29. In the memory hole MH, the exposed portions of the members 28 and 29 corresponding to the shape of the memory hole MH are thereby covered with the memory layer 32.

Note that the thickness of the memory layer 32 is controlled so that the memory layer 32 does not block the memory hole MH.

A semiconductor layer 31 is formed on the memory layer 32 by, for example, CVD. The semiconductor layer 31 is, for example, a silicon layer. Note that the thickness of the semiconductor layer 31 is controlled so that the semiconductor layer 31 does not block the memory hole MH.

A core layer (insulating layer) 30 is formed on the semiconductor layer 31 by, for example, CVD. As a result of the formation of the core layer 30, the memory hole MH is blocked.

Simultaneously with the formation of the memory layer 32, the semiconductor layer 31, and the insulating layer 30 in the memory cell array formation region 10, the layer 32A, the semiconductor layer 31A, and the insulating layer 30A are formed in the mark area A2 as members of the separators 3.

The material of the layer (hereinafter also referred to as a "laminated film") 32A is the same as the material of the memory layer 32. The material of the semiconductor layer 31A is the same as the material of the semiconductor layer 31. The material of the insulating layer 30A is the same as the material of the insulating layer 30.

In the present embodiment, the trenches 991 of the separation regions 990 are accordingly filled with the layers 30A, 31A, and 32A.

To fill the trenches 991, not only the layers 30A, 31A, and 32A, but also another member (such as an insulating layer) may be formed in the trenches 991.

For example, chemical mechanical polishing (CMP) or etch-back are performed on the layers 30, 31, 32, 30A, 31A, and 32A on the top surface of the layer stack 200X with the top surface of the layer stack 200X used as a stopper. The core layers 30 and 30A, the semiconductor layers 31 and 31A, and the memory layers (laminated films) 32 and 32A are removed from the top surface of the layer stack 200X.

Accordingly, memory pillars MP are formed in the memory holes MH of the memory cell array formation region 10. For example, the Z-directional upper end of each memory pillar MP is substantially at the same position as the position of the top surface of the layer stack 200X.

As described above, simultaneously with the formation of the memory pillars MP, separators 3 are formed in the separation regions 990 of the mark area A2. Consequently, the mark arrangement regions 910 in the mark area A2 are separated from one another by the separators 3 in the alignment direction of the mark portions 5.

In the present embodiment, simultaneously with the formation of the memory holes MH in the chip area and formation of the members in the memory holes MH, the separators 3 in the mark area A2 are formed. Consequently, the layer stacks and the mark arrangement regions can be separated, without an extra process for forming the separators.

Thereafter, the layer stack 200X is divided into a portion 300 in the chip area A1 (memory cell array formation region) and a portion 200 in the mark area A2 (dicing area 999) by lithography and etching.

As shown in FIGS. 3 to 6, an end of the layer stack in the chip area A1 is processed into a staircase shape by a known technique. A layer stack 300 having a staircase structure 8A is thereby formed in the chip area A1.

For example, simultaneously with the formation of the staircase structure 8A of the layer stack 300 in the chip area A1, an end of each layer stack in the mark area A2 is processed into a staircase shape. Layer stacks 200 (200a, 200b, and 200c) each having the staircase structure 8B are thereby formed in the mark area A2.

Replacement processing to replace the sacrificial layers is performed on the layer stack 300 in the chip area A1. The sacrificial layers in the layer stack in the chip area A1 are selectively removed. Conductive layers 22, 23, and 24 are formed in the spaces formed by the removal of the sacrificial layers.

The sacrificial layers in the layer stack are thereby replaced with the conductive layers 22, 23, and 24.

For example, the replacement processing of the insulating layers with the conductive layers 22, 23, and 24 is not performed on the layers of the layer stack in the mark area (dicing area). For example, before the replacement processing, a protection film (such as an insulating layer) is formed on the layer stack 200. The layer stack 200 is thereby covered with the protection film.

Therefore, after formation of the conductive layers by the replacement processing, the layer stack 200 in the mark area A2 maintains the structure including the insulating layers 28 and insulating layers 29.

The replacement processing to form the conductive layers 22, 23, and 24 may be performed before the division of the layer stack 200X between the areas A1 and A2 or before the formation of the staircase structure in the layer stack.

An insulating layer (not shown) is formed on the wafer 90. The layer stack 300 in the chip area A1 and the layer stack 200 in the mark area A2 are thereby covered with the insulating layer.

Thereafter, a plurality of interconnects (such as bit lines), a plurality of plugs, and a plurality of insulating layers are formed above the layer stack 300 in the chip area A1 by a known technique.

When the interconnects and plugs are formed, the marks in the mark area A2 are used for alignment of the mask, or the like.

Thereafter, the wafer 90 is divided into a plurality of chips 9 by dicing along the dicing areas (dicing lines) 999. At this time, the various mark portions 5 in the dicing areas 999 may be divided or removed from the chip 9.

The memory device of the present embodiment is formed by the above processes.

<Manufacturing Method 2>

A second example of the method of manufacturing the memory device of the embodiment will be described with reference to FIGS. 19 to 21.

The separation of the mark arrangement regions and formation of the separators in the mark area may be performed in a process different from that of the formation of the memory holes (and memory pillars) in the chip area.

Figure 19:
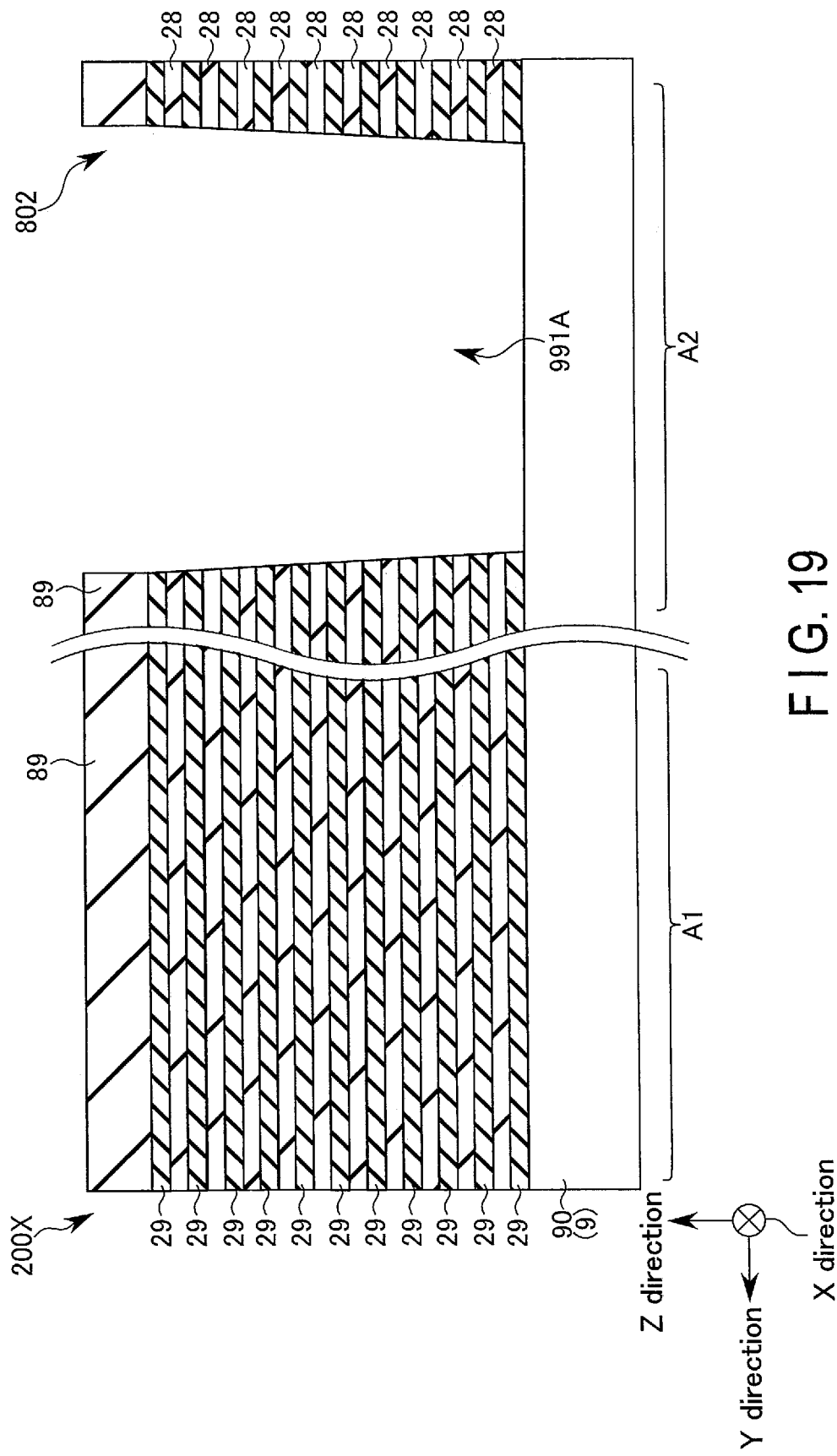

FIG. 19 is a schematic cross-sectional view for explaining a process in the method of manufacturing the flash memory of the present embodiment. FIG. 19 shows a cross section of the chip area and mark area taken along the Y direction.

As shown in FIG. 19, selective etching is performed on the separation regions 990 of the layer stack 200X in the mark area A2.

For example, a mask layer 89 is formed above the layer stack 200X. The mask layer 89 includes a pattern of holes 802 in a portion overlapping the separation region 990 in the Z direction. The mask layer 89 is provided above the memory cell array formation region 10 and the mark portions 5 to cover them.

Etching is performed on the layer stack 200X using the mask layer 89.

As a result, trenches 991A are formed in the separation region 990 of the layer stack 200X.

Figure 20:
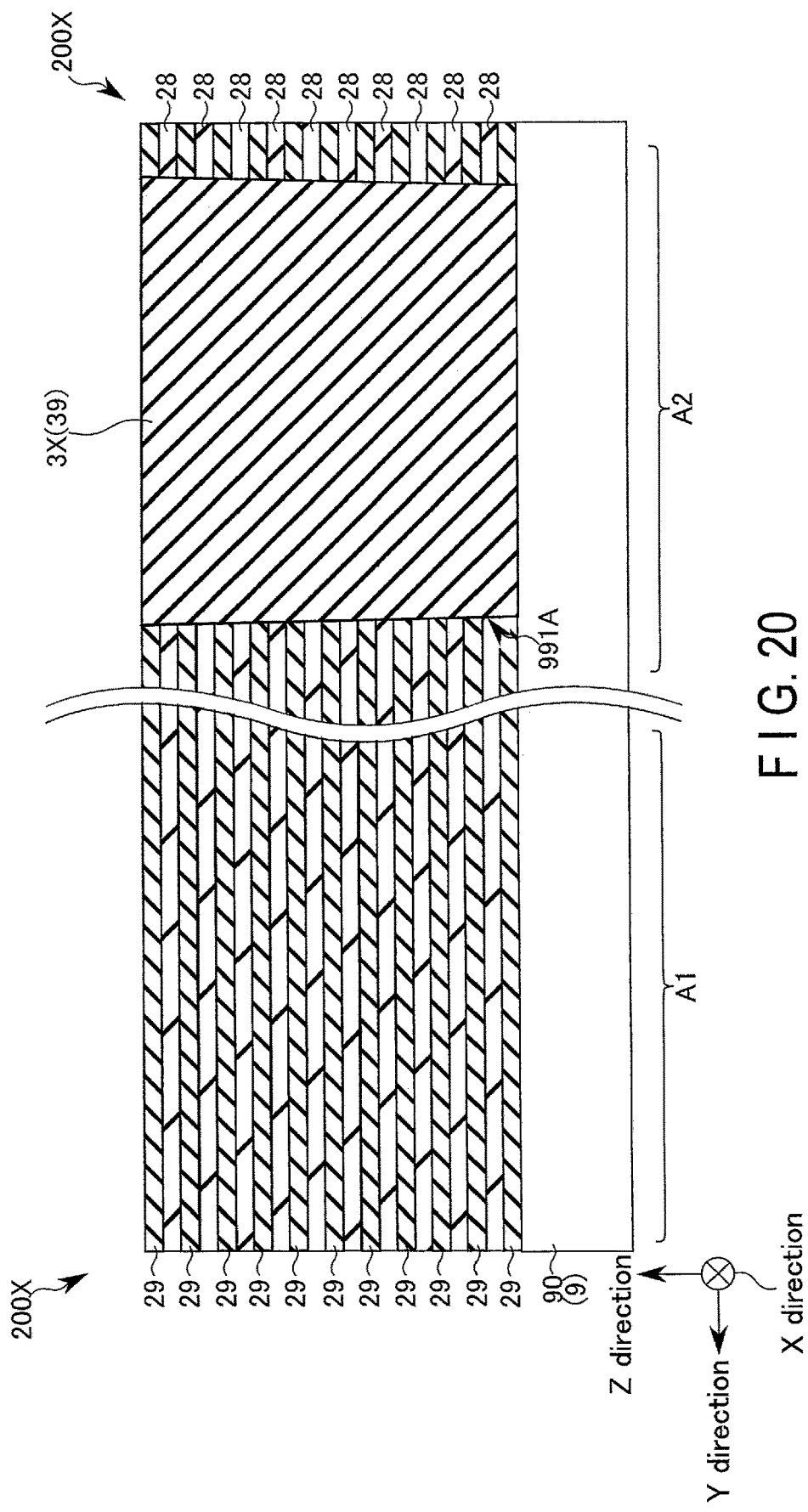

As shown in FIG. 20, after the mask layer is removed, separators 3X are formed in the respective trenches 991 by, for example, CVD. For example, an insulator 39 is filled in each trench 991.

Figure 21:
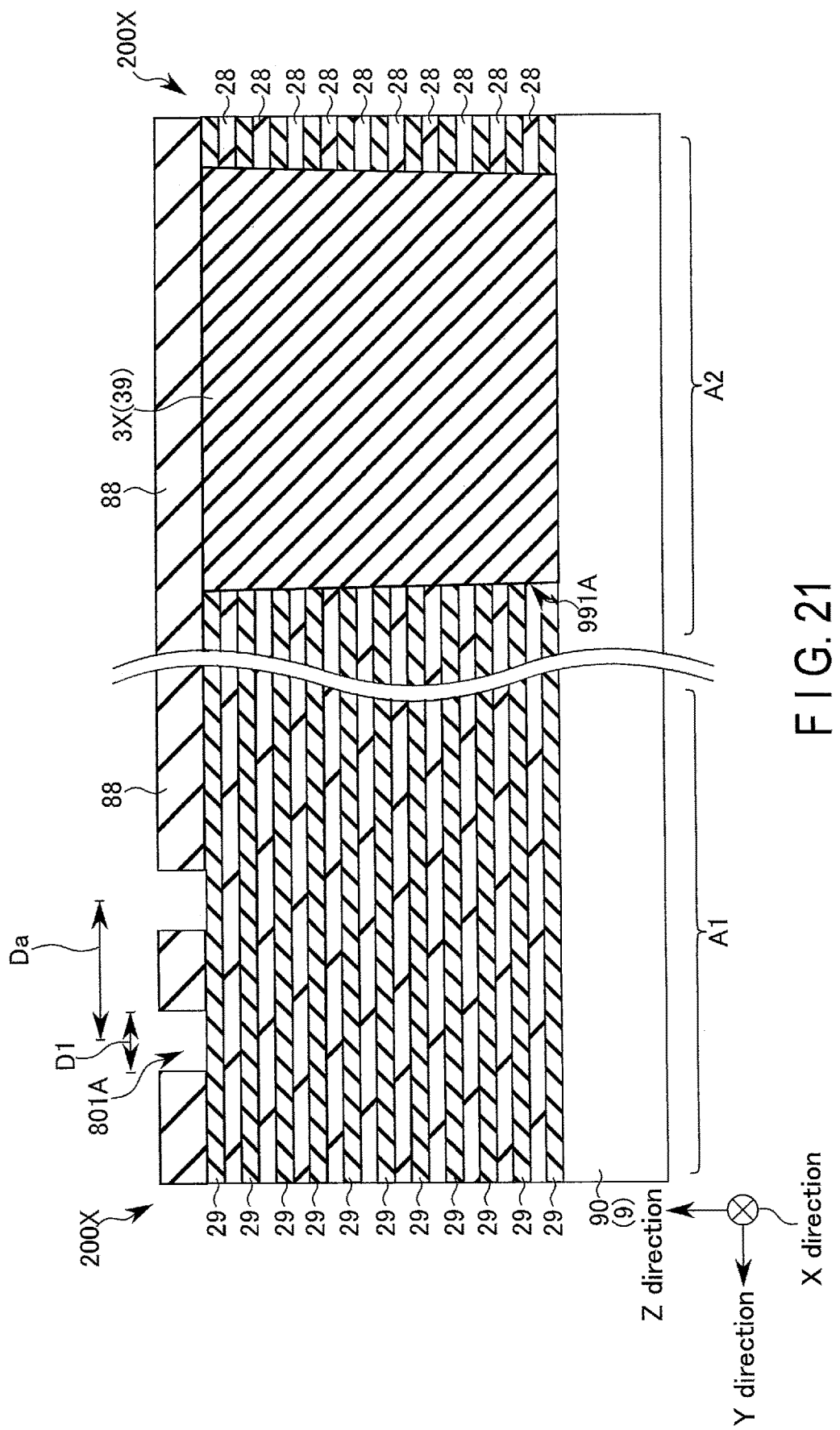

As shown in FIG. 21, a mask layer 88 is formed above the layer stack 200X. The mask layer 88 has a pattern of holes 801A for forming memory holes MH. The mask layer 88 does not have a pattern of holes in the mark area A2.

Etching is performed on the layer stack 200X using the mask layer 88.

Accordingly, memory holes MH are formed only in the memory cell array formation region 10 in the chip area A1 in the layer stack 200X.

Thereafter, the above-described processes after that of FIGS. 17 and 18 are performed.

Accordingly, the flash memory of the present embodiment is formed.

The separators 3X may be formed in the mark area A2 by the process of FIGS. 19 and 20 after formation of the memory holes and memory pillars.

The process of FIGS. 19 and 20 may be performed simultaneously with the process of forming holes other than the memory holes (such as a process of forming contact holes) in the chip area A1. In this case, the material of the separators 3X may include a conductor.

(c) Modifications

The layers forming the layer stack 200 in the mark area A2 are not limited to the silicon nitride layer and silicon oxide layer.

For example, the layer stack 200 may include a plurality of conductive layers and a plurality of insulating layers.

In this case, the layer stack has a structure in which a conductive layer and an insulating layer are alternately stacked in the Z direction. For example, the conductive layers in the mark area A2 are formed simultaneously with the conductive layers in the layer stack 300 in the chip area A1 by the replacement processing of the insulating layers 28 with conductive layers.

The layer stack 200 may include a plurality of semiconductor layers and a plurality of insulating layers.

In this case, the layer stack 200 has a structure in which a semiconductor layer and an insulating layer are alternately stacked in the Z direction.

(d) Conclusion

In recent years, miniaturization of semiconductor integrated circuits has become difficult, and the miniaturization pace has been reduced. To increase the storage capacities of memory devices without miniaturization, use of a three-dimensional structure for memory cell arrays has been promoted.

In a memory device having a three-dimensional structure, the position of a formed structure may be displaced from a desired position due to an influence of the membrane stress of a material of a film which occurs during formation of a layer stack. For example, when layers of different materials are included in one structure (layer stack), displacement occurs due to the stress difference between layers of different materials. As the volume of the layer stack increases, the displacement more often occurs.

In the dicing areas of the wafer, mark portions (such as marks for an overlay test) referred to when overlaying structures formed in respective processes are arranged. If a structure in the dicing line portion including the mark is displaced by the stress, displacement may occur between structures overlapping in the Z direction also in the main body of the semiconductor integrated circuit.

This may cause a defect in the semiconductor integrated circuit (such as a memory device).

In the memory device of the present embodiment, a plurality of mark portions are provided in the layer stack in the dicing area. In the present embodiment, a separator is provided in a region between mark portions. Accordingly, a plurality of regions (layer stacks) respectively provided with mark portions are separated from one another. Therefore, the volume of the layer stack including the mark portions is reduced according to the present embodiment.

Consequently, the stress that occurs in the layer stack can be reduced in the present embodiment.

As a result, displacement of constituent elements of the device can be suppressed in the present embodiment.

In addition, the method of manufacturing the memory device of the present embodiment can improve the yield of the memory devices.

Accordingly, the memory device and method of manufacturing the same can reduce defects of memory devices.

(e) Others

In the embodiment, a NAND flash memory is described as an example of the memory device. However, the memory device of the embodiment may be a memory device other than the NAND flash memory, such as a NOR flash memory, a DRAM, an SRAM, a magnetic memory, a resistance change memory, or a phase change memory. In addition, the device of the embodiment may be a semiconductor device other than the memory device, such as a system LSI, a power MOS device, an image sensor, or a semiconductor analog circuit.

The expression "couple" herein does not exclude, for example, existence of another constituent element between the coupled constituent elements. Further, the expression "contact" does not exclude, for example, existence of another constituent element between the constituent elements in contact with each other.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
    a first stack provided in a first area of a substrate;
    second and third stacks provided in a second area of the substrate and separated from the first stack, the second area being provided between an edge of the substrate and the first area;
    a memory cell provided in the first stack, the memory cell including:
        a first insulating layer provided in the first stack and extending in a first direction perpendicular to a surface of the substrate;
        a memory layer provided between the first insulating layer and the first stack; and
        a first semiconductor layer provided between the first insulating layer and the memory layer;
    a first mark portion buried inside the second stack, a material of the first mark portion being different from a material of the second stack;
    a second mark portion buried inside the third stack, a material of the second mark portion being different from a material of the third stack; and
    a first portion provided between the second stack and the third stack and separating the second stack from the third stack, the first portion including:
        cylindrical portions arranged in a second direction parallel to a surface of the substrate, each of the cylindrical portions extending in the first direction, the cylindrical portions being connected to each other in the second direction, a material of each of the cylindrical portions being identical to a material of the first insulating layer;
        a first layer provided between the cylindrical portions and the second stack and between the cylindrical portions and the third stack, a material of the first layer being identical to a material of the memory layer;
        a second semiconductor layer provided between the cylindrical portions and the first layer, a material of the second semiconductor layer being identical to a material of the first semiconductor layer.

2. The memory device according to claim 1, wherein the first stack includes a second layer and a third layer, the second stack includes a fourth layer and a fifth layer, and a material of the fourth layer differs from a material of the second layer and differs from a material of the third layer.

3. The memory device according to claim 2, wherein a material of the fifth layer differs from the material of the second layer and is identical to the material of the third layer.

4. The memory device according to claim 1, wherein the second stack and the third stack include staircase structures in end portions of the second stack and the third stack in a third direction, the third direction being parallel to a surface of the substrate.

5. The memory device according to claim 1, wherein the second stack includes second layers and third layers stacked in the first direction,
the third stack includes fourth layers and fifth layers stacked in the first direction,
the first mark portion is surrounded by the second layers and the third layers in the second stack, and
a second mark portion is surrounded by the fourth layers and the fifth layers in the third stack.

6. The memory device according to claim 1, wherein the first portion is provided between the first mark portion and the second mark portion.

* * * * *